US007947898B2

(12) United States Patent
Itami et al.

(10) Patent No.: US 7,947,898 B2
(45) Date of Patent: *May 24, 2011

(54) PHOTOELECTRIC CONVERSION ELEMENT AND SOLAR CELL

(75) Inventors: Akihiko Itami, Hachioji (JP); Tomoko Sakimura, Hino (JP); Fumitaka Mochizuki, Tokyo (JP); Hideya Miwa, Hachioji (JP)

(73) Assignee: Konica Minolta Business Technologies, Inc., Tokyo (JP)

( * ) Notice: Subject to any disclaimer, the term of this patent is extended or adjusted under 35 U.S.C. 154(b) by 237 days.

This patent is subject to a terminal disclaimer.

(21) Appl. No.: 12/008,598

(22) Filed: Jan. 11, 2008

(65) Prior Publication Data
US 2008/0178933 A1 Jul. 31, 2008

(30) Foreign Application Priority Data

Jan. 31, 2007 (JP) ................................ 2007-020738

(51) Int. Cl.
H01L 31/00 (2006.01)
H01L 51/00 (2006.01)
H01L 21/00 (2006.01)
C07C 211/00 (2006.01)
H01M 6/30 (2006.01)

(52) U.S. Cl. .............. 136/263; 136/252; 257/40; 257/3; 257/431; 438/85; 438/82; 564/434; 564/305; 429/111

(58) Field of Classification Search .................. 136/243, 136/258, 260, 263, 264, 252; 257/292, 293, 257/3, 40, 431; 438/82, 85; 564/434, 305; 429/111

See application file for complete search history.

(56) References Cited

U.S. PATENT DOCUMENTS

2004/0121068 A1* 6/2004 Bellmann et al. ............... 427/66
2006/0130249 A1* 6/2006 Ikeda et al. ....................... 8/550

FOREIGN PATENT DOCUMENTS

JP 2005-123033 A 5/2005
JP 2006-079898 * 3/2006

OTHER PUBLICATIONS

Xu et al. New Triphenylamine-based Dyes for Dye-Sensitized Solar Cells J. of Phys. Chemistry 112, 874-880, Jan. 1, 2008.*
Hayashi "Electrical propertis of composites of TiO2-triphenylamine derivatives" p. 337-340, Thin Solid Films 474 Dec. 2005.*
Inoue et al. JP2006-079898, Mar. 2006, Machine Translation.*

(Continued)

Primary Examiner — Jeffrey T Barton
Assistant Examiner — Devina Pillay
(74) Attorney, Agent, or Firm — Holtz, Holtz, Goodman & Chick, P.C.

(57) ABSTRACT

A photoelectric conversion element is disclosed, comprising a compound represented by the following formula between a pair of opposed electrodes:

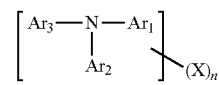

wherein $Ar_1$, $AR_2$ and $Ar_3$ are each a substituted or unsubstituted aryl or a substituted or unsubstituted heterocyclic group, x is an organic residue having an acidic group and n is an integer of 2 to 8. A solar cell comprising the photoelectric conversion element is also disclosed.

12 Claims, 1 Drawing Sheet

OTHER PUBLICATIONS

Meng, "Novel Cyanine Dyes with Multi-Carboxy groups and their sensitization on Nanocrystalline TiO2 Electrode", Synthetic Metals, 137 Dec. 2003 1543-1544.*

Brian O'Regan & Michael Gratzel, "A low-cost high-efficiency solar cell based on dye-sensitized colloidal $TiO_2$ films", *Nature*, 353, p. 737 (1991). (Abstract and identification of References only).

* cited by examiner

PHOTOELECTRIC CONVERSION ELEMENT AND SOLAR CELL

TECHNICAL FIELD

The present invention relates to a photoelectric conversion element and in particular to a dye-sensitized photoelectric element and a solar cell by use thereof.

TECHNICAL BACKGROUND

In recent years, there has been energetically studied employment of solar light which is inexhaustible and causes no toxic material. Practical uses of solar light as a clean energy source include inorganic solar cells for residential use, such as a single crystalline silicon, a polycrystalline silicon, made of an amorphous silicon, cadmium telluride, and indium selenide.

Shortcomings of inorganic solar cells, for example, are that silicon solar cells require extremely high purity is required, which complicates purification process and results in enhanced production cost.

On the other hand, there are a number of solar cells employing organic material. Organic solar cells include a Schottky type photoelectric conversion element in which a p-type organic semiconductor and a metal exhibiting a small work function are joined, and a hetero-junction type photoelectric conversion element in which a p-type organic semiconductor and an n-type inorganic semiconductor, or a p-type organic semiconductor and an electron-accepting organic compound are joined. There are employed organic semiconductors such as chlorophyll, synthetic dyes and pigments, e.g., perylene, electrically conductive polymeric materials and their composite materials. These materials are thin-layered through a vacuum deposition, casting or dipping method to constitute cell materials. Organic materials have advantages such as low-cost and large dimensions being readily achieved but also have problems in that almost all of them exhibit a conversion efficiency of not more than 1% and their durability is inferior.

In such a situation, a solar cell exhibiting superior characteristics was reported in B. O'Regan & M. Gratze, Nature, 353, 737 (1991). The proposed cell is a dye-sensitized solar cell and is also a wet solar cell having a working electrode of a porous titanium oxide thin-layer, spectrally sensitized with a ruthenium complex. Advantages of this system are that it is not necessary to purify a low-priced metal compound semiconductor such as titanium oxide to high purity so that it is low-cost and can employ lights extending over the broad visible region and a solar light having a large visible light content can be effectively converted to electricity.

On the other hand, a resourceless ruthenium complex is used and supply of the ruthenium complex is a concern for its practical use. The ruthenium complex has problems in that it is expensive and unstable in aging. Therefore, if it is replaced by an inexpensive and stable dye, these problems are largely overcome.

It was also disclosed that the use of a compound having a triphenylamine structure as a dye for a cell achieved an element exhibiting an enhanced photoelectric conversion efficiency, as described in JP-A No. 2005-123033 (hereinafter, the term JP-A refers to Japanese Patent Application Publication). However, such a dye was proved to have problems that adhesion to titanium oxide was low, enhanced sensitization effect was not achieved and durability was also inferior.

SUMMARY OF THE INVENTION

It is an object of the invention to provide a sensitizing dye which is used for a dye-sensitized photoelectric conversion element, is novel and exhibits enhanced conversion efficiency and improved durability; a photoelectric conversion element of high efficiency and a solar cell by use thereof.

Thus, one aspect of the invention is directed to a photoelectric conversion element comprising a compound represented by the following formula (1) between a pair of opposed electrodes:

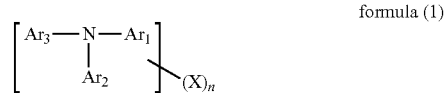

formula (1)

wherein $Ar_1$, $Ar_2$ and $Ar_3$ are each a substituted or substituted aryl or a substituted or unsubstituted heterocyclic group, provided that $Ar_1$ to $Ar_3$ may be combined with each other to form a ring; X is an organic residue having an acidic group; and n is an integer of 2 to 8.

Another aspect of the invention is directed to a solar cell comprising a photoelectric conversion element as described above.

DETAILED DESCRIPTION OF THE INVENTION

Figure 1:
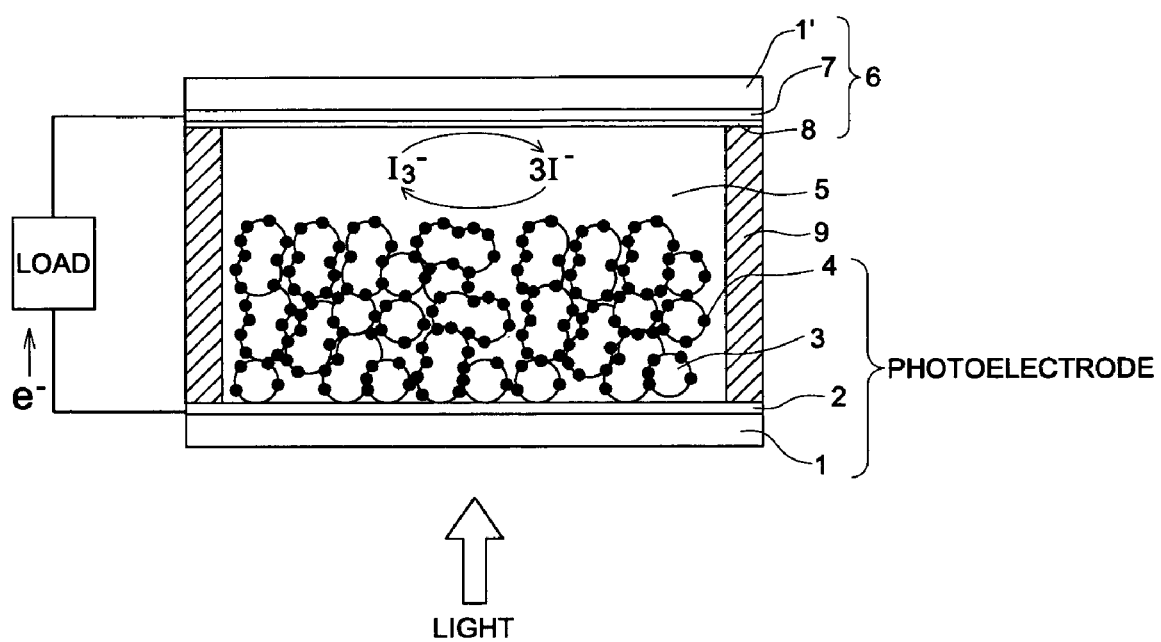
FIG. 1 illustrates a sectional view of an example of the photoelectric conversion element of the invention.

The photoelectric conversion element of the invention will be described with reference to the drawing.

FIG. 1 illustrates a sectional view of an example of the photoelectric conversion element of the invention.

As shown in FIG. 1, the photoelectric conversion. element is constituted of substrates) (1, 1'), transparent electrodes (2, 7), a semiconductor (3), a sensitizing dye (4), an electrolyte (5) and a wall (9).

There is used a photoelectrode provided with a semiconductor layer having pores formed by sintering particles of the semiconductor (3) on the substrate (1) attached to the transparent conductive layer (2), and the sensitizing dye (4) being adsorbed onto the porous surface.

An opposed electrode 6 is provided with the transparent conductive layer (7) formed of the substrate (1')and having thereon vapor-deposited platinum (8), and the electrolyte (5) is, as electrolyte layer, between the electrodes is filled with the electrolyte (5).

The invention is related to a novel sensitizing dye for use in the photoelectric conversion element.

A sensitizing dye repeats a photooxidation reaction during electric power generation, generating an electric current and a dye exhibiting strong resistance to oxidation is desired for achievement of enhanced durability. In the invention, a triphenylamine exhibiting high fastness against ozone, being a strong oxidant, is employed as a nucleus and to allow photoexcited electrons to efficiently move to the titanium oxide electrode, an acidic group is attached so as to form a structure capable of chelate-bonding to titanium oxide.

Usually, an adsorbing group of a dye molecule adsorbs strongly onto a semiconductor such as titanium oxide. Introduction of plural adsorbing groups causes an intermolecular interaction between semiconductor particles and unadsorbed free adsorbing groups, which forms a dye aggregate, leading to stabilization. It was found that this action resulted in enhanced durability, as compared to monomolecular adsorption. To achieve enhanced efficiency of transferring photoexcited electrons, it is also effective to connect an electron-withdrawing π-electron system between the triphenylamine nucleus and the acidic group. The foregoing means has provided a novel sensitizing dye exhibiting enhanced durability.

There will be described the compounds represented by the foregoing formula (1), which are hereinafter also denoted as sensitizing dyes of the invention.

In the formula (1), $Ar_1$, $Ar_2$ and $Ar^3$ are each a substituted or unsubstituted aryl or a substituted or unsubstituted heterocyclic group, provided that $Ar_1$—$Ar_3$ may combine with each other to form a ring; X is an organic group having an acidic group; and n is an integer of 2 to 8.

Examples of an aryl group represented by $Ar_1$—$Ar_3$ include a phenyl group, a naphthyl group and an anthranyl group, and examples of a heterocyclic group include an imidazole group, an oxazole group, a thiazole group, a pyrrole group, a furanyl group, a thiophenyl group, a benzimidazole group, and a benzoxazole group. The aryl group and the heterocyclic group may be substituted by a substituent, and examples of such a substituent include a halogen atom (e.g., fluorine, chlorine, bromine), and an alkyl group (e.g., methyl, ethyl, t-butyl, isobutyl, dodecyl, hydroxyethyl, methoxyethyl), an alkoxy group (e.g., methoxy), an aryl group (e.g., phenyl, tolyl), an alkenyl group (e.g., allyl), an amino group (e.g., dimethylamino) and a heterocyclic group (e.g., morpholino, furanyl), each of which may further be substituted.

The aryl group or the heterocyclic group, represented by $Ar_1$—$Ar_3$ is further substituted by an organic residue having an acidic group (that is an organic residue with an attached acidic group) and the acidic group is represented by X or $(X)_n$, in which n is an integer of 2 to 8, preferably 2 to 6 and more preferably 2 or 3. Examples of the acidic group include a carboxyl group (or carboxylic acid group), a phospho group (or phosphonic acid group) and a sulfo group (or sulfonic acid group) and a carboxyl group is preferred. The organic residue includes a hydrocarbon group and a heterocyclic group, and examples of the organic residue include an alkylene group, an alkenylene group, an arylene group, a heterocyclic group and their combinations. Examples of a preferred organic residue having an acidic group include -(alkylene)-COOH, -(arylene)-COOH, -(alkylene)-PO(OH)$_2$, —CH=C(CN)COOH, -(heterocycle)-(alkylene)-COOH, and —CH=(heterocycle)-(Alkylene)-COOH. Preferably, the acidic group is attached to $Ar_1$, $Ar_2$ or $Ar_3$ through π-conjunction. The organic residue having a acidic group is preferably one selected from the group consisting of:

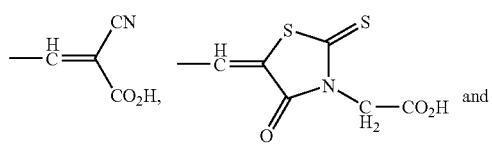

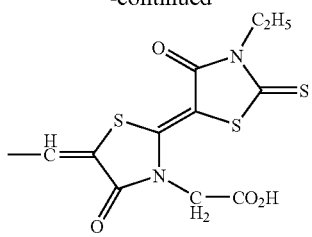

The compound represented by formula (1) is preferably represented by the following formula (2):

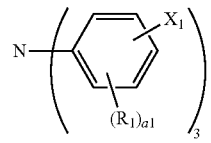

formula (2)

In the formula (2), $R_1$ is a halogen atom (e.g., fluorine, chlorine, bromine), and an alkyl group (e.g., methyl, ethyl, t-butyl, isobutyl, dodecyl, hydroxyethyl, methoxyethyl), an alkoxy group (e.g., methoxy), an aryl group (e.g., phenyl, tolyl), an alkenyl group (e.g., allyl), an amino group (e.g., dimethylamino) and a heterocyclic group (e.g., morpholino, furanyl), each of which may further be substituted; a1 is an integer of 0 to 4, provided that when a1 is 2 to 4, plural $R_1$s may be the same or different; X1 is an organic residue having an acidic group and is the same as defined in X.

The compound represented by formula (1) is preferably represented by the following formula (3):

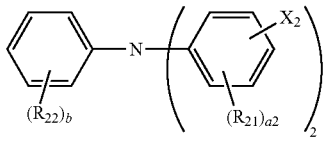

formula (3)

In the formula (3), $R_{21}$ and $R_{22}$ are each the same as defined in $R_1$ of the foregoing formula (2); a2 and b are each the same as defined in a1 of the formula (2); $x_2$ is the same as defined in x of formula (1); and a2 and b are each an integer of 0 to 4. Plural $R_{21}$ or $R_{22}$s may be the same or different.

Specific examples of the sensitizing dye of the invention are shown below but are not limited to these.

(1)-1

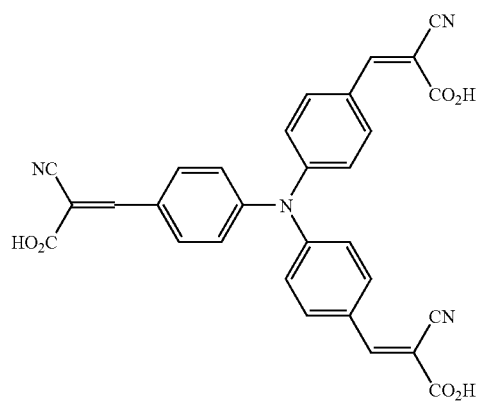

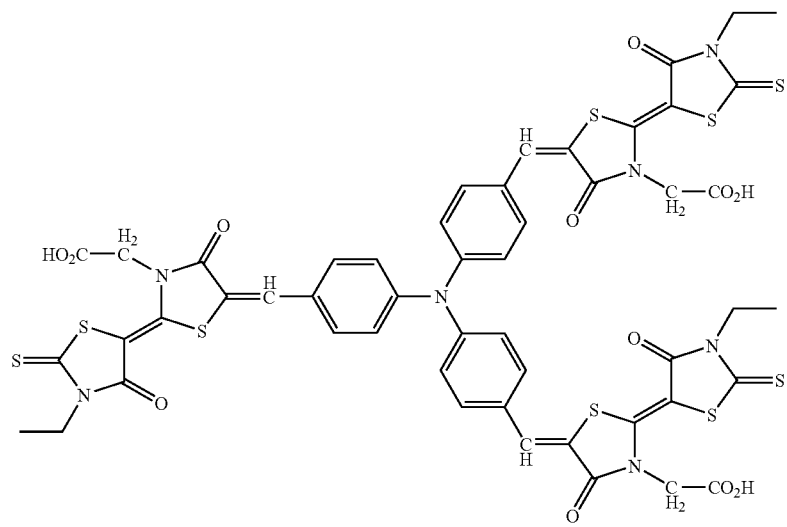
(1)-2
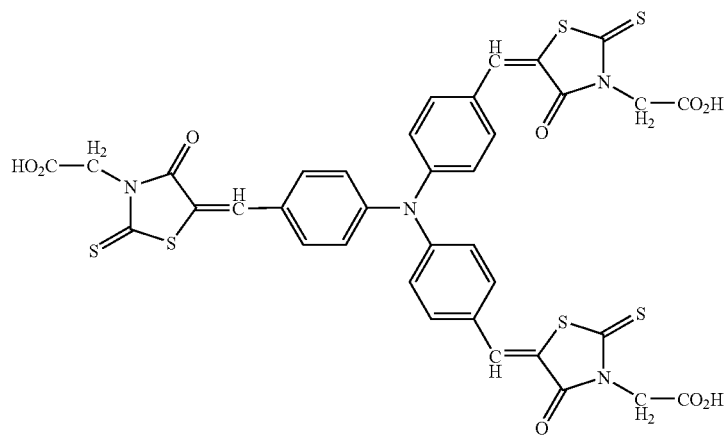
(1)-3
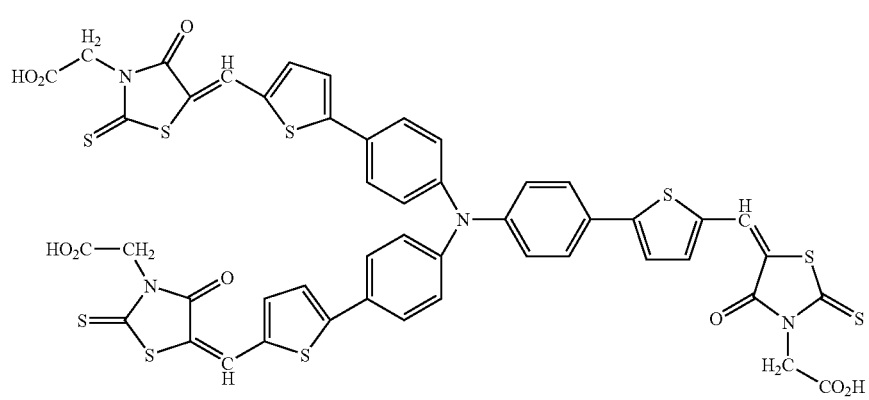
(1)-4

(1)-5
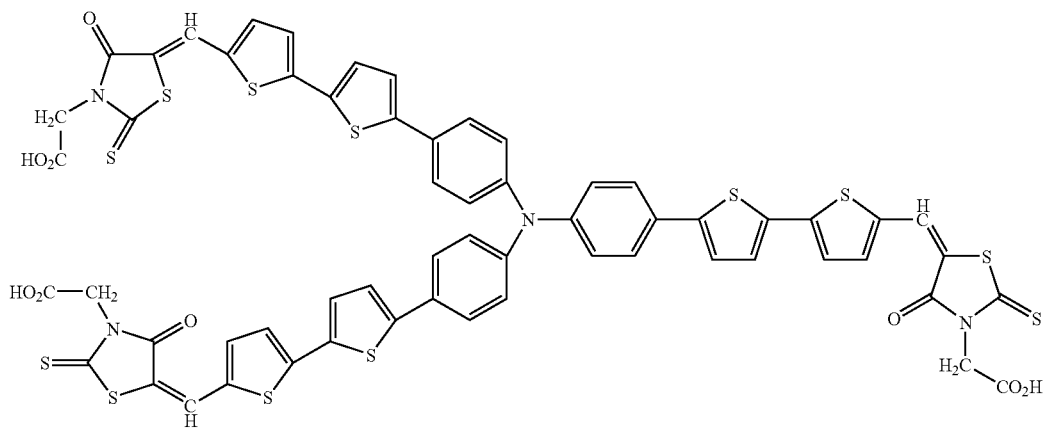
(1)-6
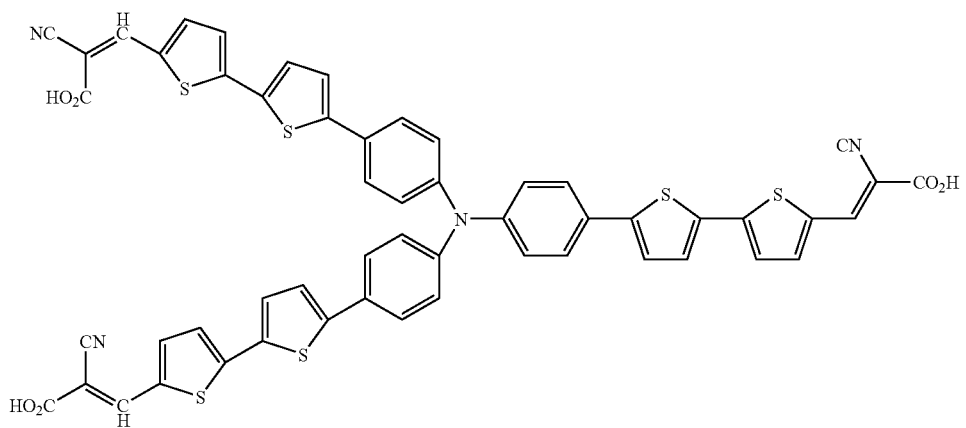
(1)-7
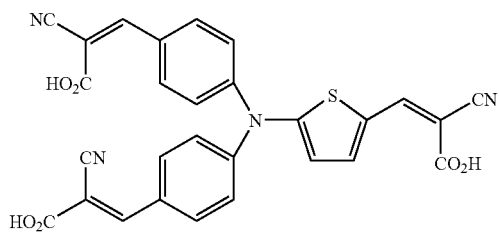

-continued
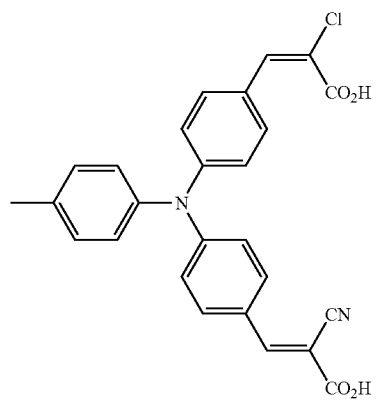
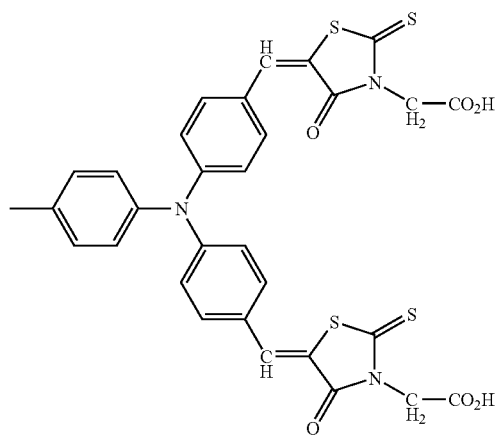
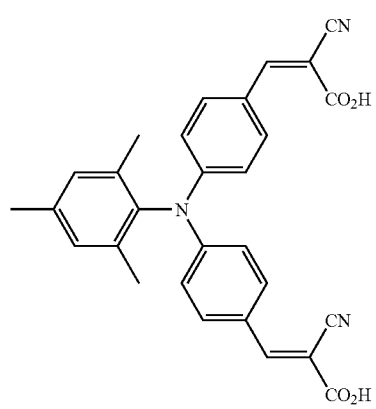
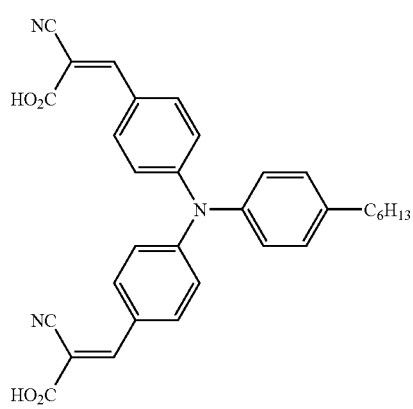
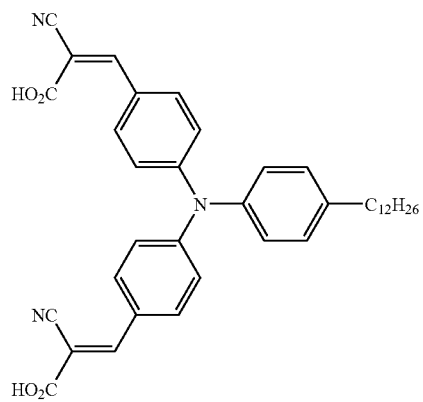
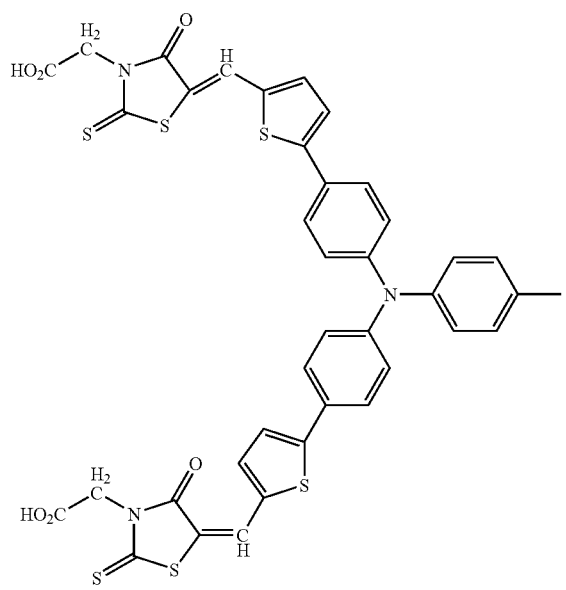

-continued
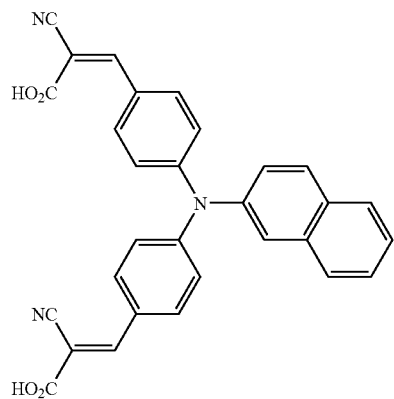
(2)-7
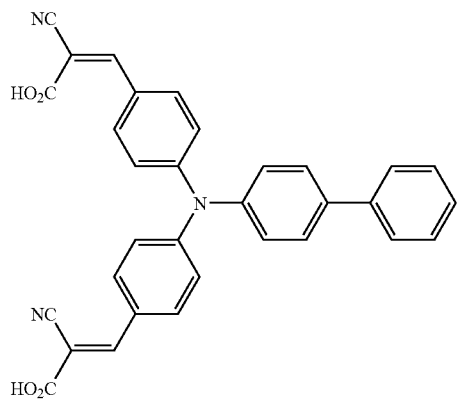
(2)-8
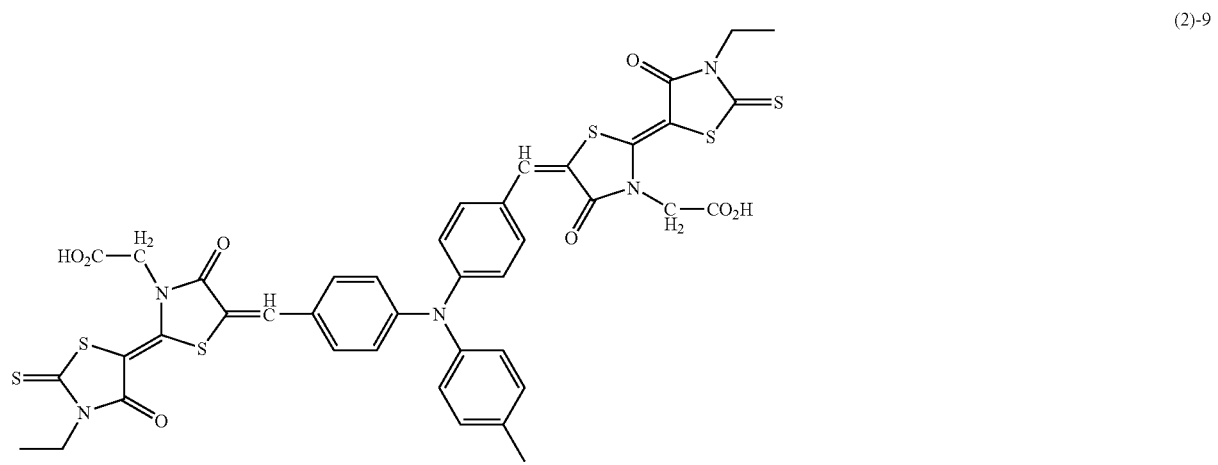
(2)-9
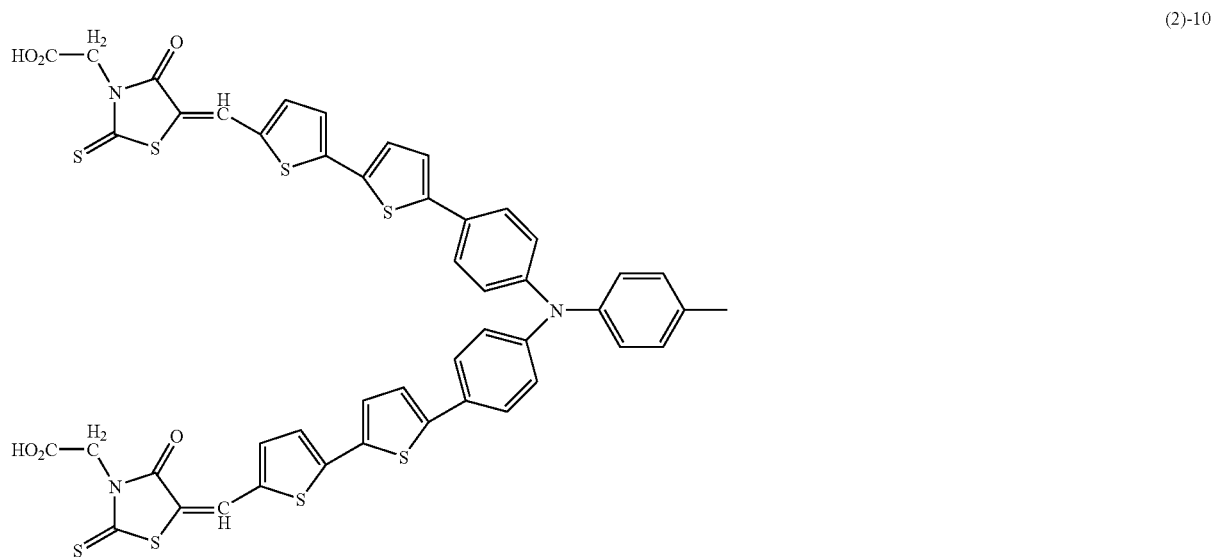
(2)-10

-continued
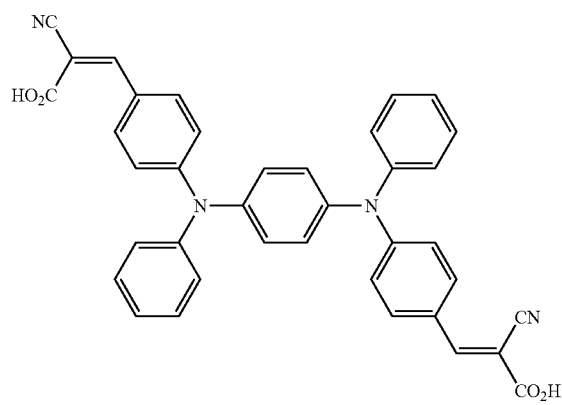
(3)-1
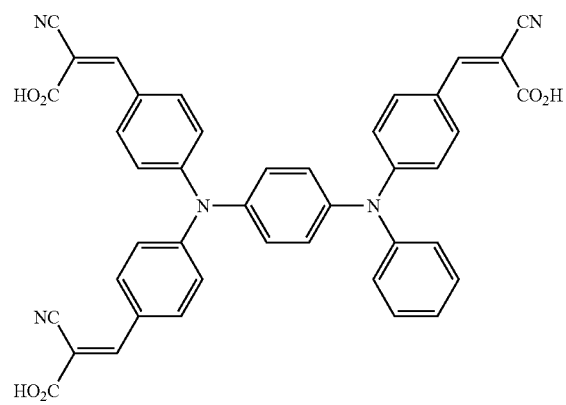
(3)-2
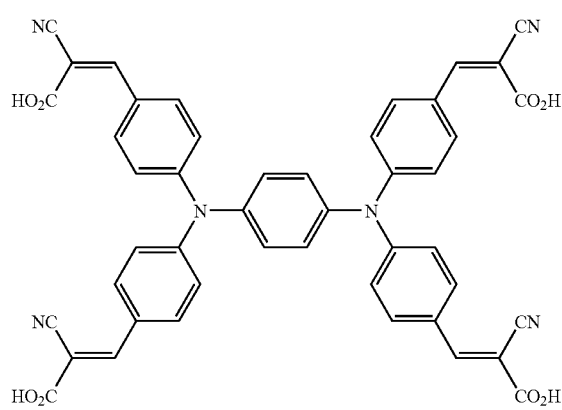
(3)-3
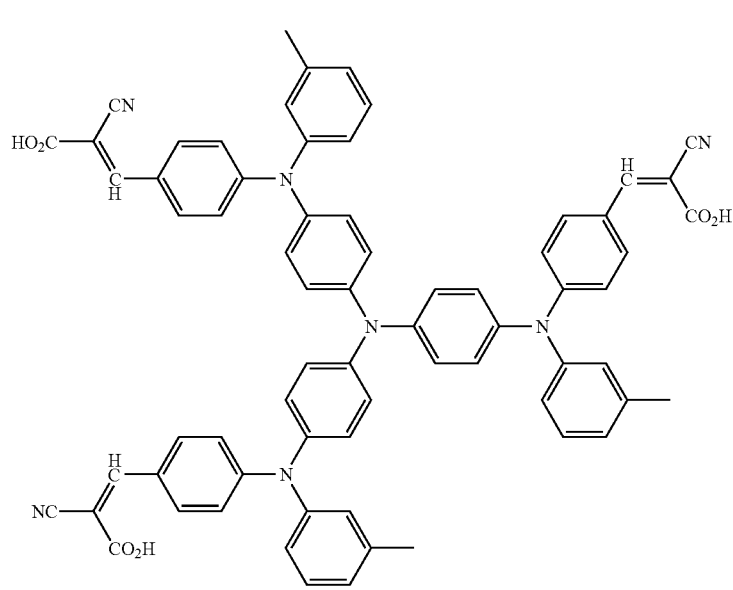
(3)-4

-continued
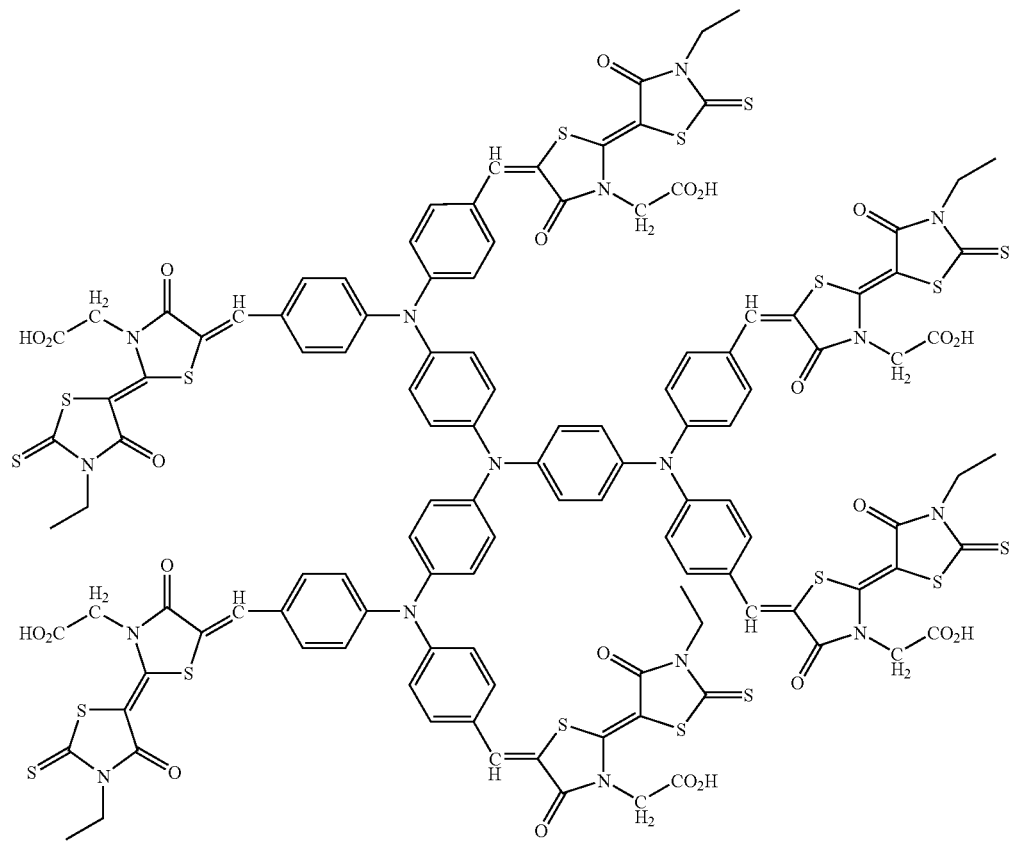
(3)-5
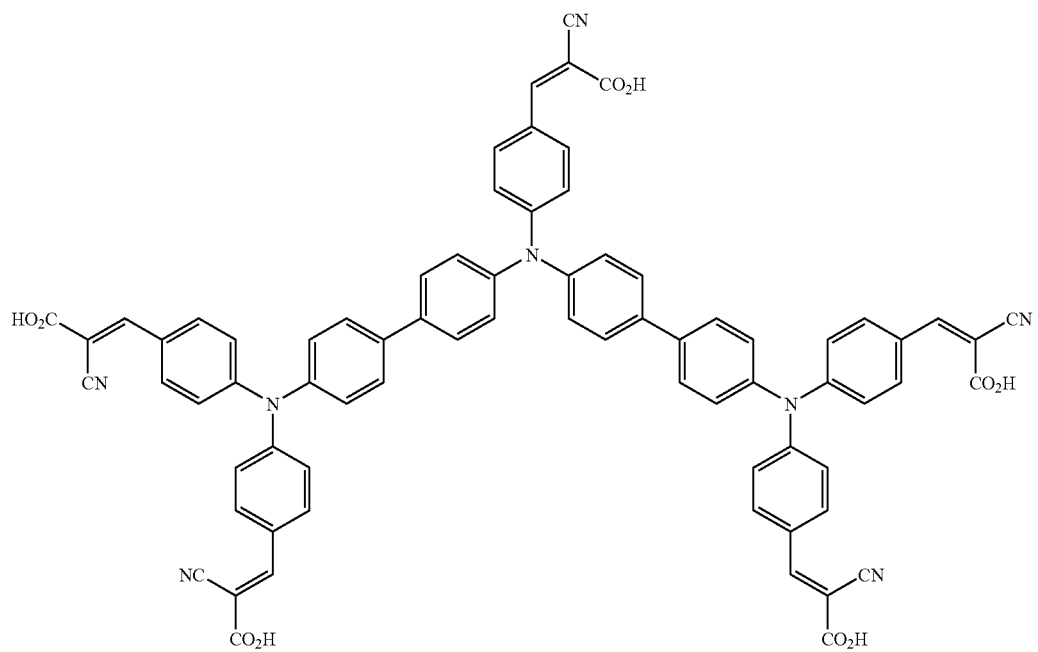
(3)-6

-continued (3)-7

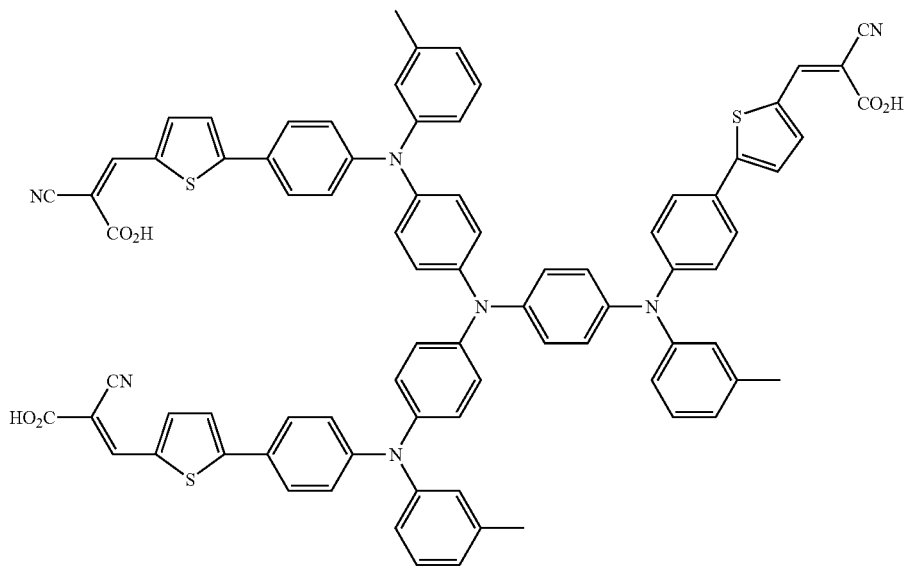

The sensitizing dyes of the invention can be synthesized in accordance with commonly known synthetic methods. A synthesis example is shown below.

Synthesis of Dye (1)-1:

To triphenylamine were added 9 equivalent weight of phosphorus oxychloride and 12 equivalent weight of N,N-dimethylformamide and heated at 60° C. for 8 hrs. in a nitrogen atmosphere to obtain a triformyl product. The obtained triformyl product was refluxed in an acetic acid solution of 3.6 equivalent weight of cyanoacetic acid and 6.6 equivalent weight of ammonium acetate with heating for 1 hr., whereby exemplified compound (1)-1 was obtained.

Other compounds can also be similarly synthesized.

The thus obtained sensitizing dye is supported by a semiconductor to achieve sensitization, enabling to realize the advantageous effects of the invention. The dye being supported by a semiconductor includes various forms, for instance, adsorption onto the semiconductor surface and in the case of a semiconductor having a porous structure, the porous structure being filled with the dye.

The total amount of the supported dye per 1 m² of the semiconductor layer (or semiconductor) is preferably from 0.01 to 100 mmol, more preferably from 0.1 to 50 mmol, and still more preferably from 0.5 to 20 mmol.

Sensitization by using the sensitizing dyes of the invention, the sensitizing dyes may be used singly or in combination, or in combination with other compounds, as described in, for example, U.S. Pat. Nos. 4,684,537, 4,927,721, 5,084,365, 5,350,644, 5,463,057 and 5,525,440; and JA-A Nos. 7-249790 and 2000-150007.

In the case of the photoelectric conversion element of the invention being used for a solar cell, two or more dyes differing in absorption wavelength ranges are preferably used so that the wavelength region for photoelectric conversion is expanded as broad as possible to achieve effective utilization of solar light.

To allow a semiconductor to support the sensitizing dye of the invention the dye, in general, is dissolved in an appropriate solvent (e.g., ethanol) and a well-dried semiconductor is immersed into the solution over a long period of time.

When using a plurality of the sensitizing dyes of the invention or the sensitizing dye in combination with other sensitizing dyes, a mixed solution of the dyes may be prepared or solutions of the individual dyes are prepared, in which a semiconductor is immersed. In the latter, immersion in the individual solutions may be conducted in any order. Further, semiconductor particles which were previously adsorbed with the sensitizing dyes may be mixed.

Sensitization of a semiconductor will be further described in the following photoelectric conversion element.

In the case of a semiconductor exhibiting a relatively high porosity, it is preferred to subject the semiconductor to a dye adsorption treatment before moisture or water vapor is adsorbed onto the semiconductor surface or into pores in the interior of the semiconductor.

There will be described a photoelectric conversion element of the invention.

The photoelectric conversion element of the invention comprises a photoelectrode comprising an electrically conductive support having thereon a semiconductor containing a dye and an opposed electrode which are opposed through an electrolyte layer. In the following, there will be described a semiconductor, a photoelectrode, an electrolyte and an opposed electrode.

Semiconductors usable in the photoelectrode include simple substances such as silicon and germanium, compounds containing elements of Groups 3-5 and 13-15 of the periodical table, metal calcogenides (e.g., an oxides, a sulfide, a selenide) and metal nitrides.

Preferred metal calcogenides include an oxide of titanium, tin, zinc, iron, tungsten, zirconium, hafnium, strontium, indium, cerium, yttrium, lanthanum, vanadium, niobium or tantalum; a sulfide of cadmium, zinc, lead, silver, antimony or bismuth; a selenide of cadmium or lead; and a telluride of cadmium. Compound semiconductors include a phosphide of zinc, gallium, indium or cadmium; a gallium—arsine or copper—indium selenide; a copper—indium sulfide and a titanium nitride. Specific examples include $TiO_2$, $SnO_2$, $Fe_2O_3$, $WO_3$ ZnO, $Nb_2O_5$, CdS, ZnS, PbS, $Bi_2S_3$, CdSe, CdTe, GaP, InP, GaAs, $CuInS_2$, $CuInSe_2$ and $Ti_3N_4$. Of these, $TiO_2$, ZnO, $SnO_2$, $Fe_2O_3$, $WO_3$, $Nb_2O_5$, CdS and PbS are preferred, $TiO_2$ and $Nb_2O_5$ are more preferred and $TiO_2$ is specifically preferred.

Plural semiconductors may be used in combination for the photoelectrode. For instance, plural kinds of the foregoing metal oxides or metal sulfides may be used in combination, or a titanium oxide semiconductor may be mixed with 20% by weight of titanium nitride ($Ti_3N_4$). There may also be used a zinc oxide/tin oxide composite, as described in J. Chem. Soc., Chem. Commun., 15 (1999). In that case, when incorporating an additional semiconductor component other than the metal oxide or metal sulfide, the additional component is incorporated preferably in an amount of not more than 30% by mass of the metal oxide or metal sulfide.

Semiconductors relating to the invention may be subjected to a surface treatment by using organic bases. Examples of organic bases include a diarylamine, a triarylamine, pyridine, 4-t-butylpyridine, polyvinylpyridine, quinoline, piperidine, and amidine. Of these are preferred pyridine, 4-t-butylamidine and polyvinylpyridine.

A liquid organic base is used as such and a solid organic base is dissolved in an organic solvent, and a semiconductor relating to the invention is immersed in the liquid amine or the amine solution to perform a surface treatment.

Electrically conductive supports used for the photoelectric conversion element or solar cell of the invention can employ an electrically conductive material such as a metal plate and an electrically non-conductive material (e.g., glass, plastic film) provided with an electrically conductive material. Examples of a material used for the electrically conductive support include metals (e.g., platinum, gold, silver, copper, aluminum, rhodium, indium), conductive metal oxides (e.g., indium-tin composite oxide, fluorine-doped tin oxide), and carbon. The thickness of an electrically conductive support is not specifically limited but preferably is in the range of 0.3 to 5 mm.

The electrically conductive support is preferably substantially transparent. The expression, being substantially transparent means that the light transmittance is not less than 10%, preferably not less than 50%, and more preferably not more than 80%. To obtain a transparent conductive support, the surface of a glass plate or a plastic film is provided preferably with an electrically conductive layer comprised of an electrically conductive metal oxide. When using a transparent conductive support, light is entered preferably from the support side.

The surface resistance of an electrically conductive support is preferably not more than 50 $\Omega/cm^2$ and more preferably not more than 10 $\Omega/cm^2$.

In the following, there will be described a preparation method of a photoelectrode relating to the invention.

In cases where a semiconductor used for a photoelectrode relating to the invention is in the form of particles, the semiconductor is coated onto or sprayed onto the conductive support to prepare a photoelectrode. In cases where a semiconductor is in the form of film and is not supported by a conductive support, the semiconductor is adhered onto the conductive support to prepare a photoelectrode.

In one preferred embodiment of the invention, the photoelectrode is formed by sintering semiconductor particles onto the conductive support. When preparing a semiconductor relating to the invention through sintering, a sensitization treatment (adsorption, filling of a porous layer or the like) of the semiconductor by using a sensitizing dye is conducted preferably after sintering. It is specifically preferred to conduct an adsorption treatment of a compound promptly after sintering and before moisture adsorption onto the semiconductor.

There will be further described a method of forming a photoelectrode by sintering semiconductor particles.

First, there is prepared a coating solution containing semiconductor particles. The semiconductor particles are preferably minute with respect to primary particle size and the primary particle size is preferably in the range of 1 to 5000 nm, and more preferably 2 to 50 nm. The coating solution containing fine semiconductor particles can be prepared by dispersing fine semiconductor particles in a solvent. The fine semiconductor particles are dispersed in the form of primary particles. Any solvent capable of dispersing fine semiconductor particles is unlimitedly usable. Such solvents include water, organic solvents and mixtures of water and an organic solvent. Specific examples of organic solvent usable in the invention include alcohols such as methanol and ethanol, ketones such as acetone and acetylacetone, and hydrocarbons such as hexane and cyclohexane. Surfactants or a viscosity-adjusting agent (a polyvalent alcohol such as polyethylene glycol) may optionally be added to a coating solution. The content of fine semiconductor particles in a coating solution is preferably in the range of 0.1 to 70% by mass, and more preferably 0.1 to 30% by mass.

The thus obtained coating solution containing fine semiconductor particles is coated or sprayed onto a conductive support, dried and sintered in the air or in an inert gas to form a semiconductor layer (or semiconductor film) on the conductive support.

The film obtained by coating and drying a coating solution containing fine semiconductor particles is constituted of an aggregate of fine semiconductor particles and the particle size of the fine particles corresponds to the primary particle size of the fine semiconductor particles.

A semiconductor particle layer formed on an electrically conductive layer such as an electrically conductive support is weakly bonded to the conductive support or poorly interacts with the fine particles, resulting in poor mechanical strength. To counter this, the semiconductor particle layer is subjected to a sintering treatment to form a semiconductor layer of enhanced mechanical strength, which strongly adhered to the substrate.

In the invention, the semiconductor layer may have any appropriate structure but a porous-structured layer (or a porous layer having voids) is preferred. The porosity of the semiconductor layer is preferably not more than 10% by volume, more preferably not more than 8% by volume, and still more preferably in the range of 0.01 to 5% by volume. The porosity of the semiconductor layer, means a porosity of pores penetrating in the thickness direction of the semiconductor layer, can be measured by a commercially available instrument such as a mercury porosimeter (PORELIZER 9220, produced by Shimazu Seisakusho).

To obtain a sintered layer of the foregoing porosity with controlling the real surface area of the sintered layer during the sintering treatment, the sintering temperature is preferably not higher than 1000° C., more preferably in the range of 200 to 800° C., and still more preferably 300 to 800° C.

The ratio of real surface area to apparent surface area can be controlled by the particle size, specific surface area or sintering temperature for the semiconductor particles. In order to increase the surface area of semiconductor particles, enhanced purity in the vicinity of semiconductor particles or enhanced efficiency of electron injection of from a dye to semiconductor particle, after a heating treatment, there may be conducted a chemical plating treatment using an aqueous titanium tetrachloride solution or an electrolytic plating treatment using an aqueous titanium trichloride solution.

A sensitization treatment for a semiconductor is conducted in such a manner that the afore-described sensitizing dye of the invention is dissolved in an appropriate solvent to form a solution, after which the semiconductor-sintered substrate is immersed in the solution. Preferably, the substrate having a semiconductor layer formed by sintering is preliminarily subjected to an evacuation treatment or to a heating treatment to remove air bubbles in the layer. Such a treatment enables entry of the sensitizing dye of the invention into the interior of the semiconductor layer (or semiconductor film), which is specifically preferred for a porous-structured semiconductor layer.

A solvents used to make a solution of the sensitizing dye of the invention may employ any one which can dissolve the foregoing compounds without dissolving or reacting with the semiconductor. However, it is preferred to subject the solvent to preliminarily degassing or distillation purification to prevent moisture or gas dissolved in the solvent from entering the semiconductor layer, whereby adsorption of the foregoing dye compound is hindered, resulting in inhibited sensitization.

Preferred solvents used for solution of the foregoing dye compounds include an alcoholic solvent such as methanol, ethanol or propanol; a ketone solvent such as acetone or methyl ethyl-ketone; an ether solvent such as diethyl ether, diisopropyl ether, tetrahydrofuran or 1,4-dioxane; and a halogenated hydrocarbon solvent such as methylene chloride or 1,1,2-trichloroethane. Of these, methanol, ethanol, acetone, methyl ethyl ketone; tetrahydrofuran and methylene chloride are specifically preferred.

The time of immersion of the semiconductor-sintered substrate in a solution containing the sensitizing dye of the invention is preferably one during which the dye enters deeply into the semiconductor layer (or semiconductor film), promoting adsorption and achieving sufficient sensitization of the semiconductor. Also taking into account that a decomposition product produced in decomposition of a sensitizing dye in the solution inhibits adsorption of the dye, the time of immersion is preferably from 3 to 48 hrs. at 25° C., and more preferably from 4 to 24 hrs. This effect is remarkable in a porous-structured semiconductor layer. The foregoing immersion time is at 25° C. and it is not limited thereto when the temperature condition varies.

A solution containing the sensitizing dye of the invention may be heated to a temperature causing no boiling, unless the dye is decomposed. The temperature range is preferably from 10 to 100° C., and more preferably from 25 to 80° C., unless the solvent boils.

In the photoelectric conversion element of the invention, an electrolyte is filled between opposed electrodes and forms an electrolyte layer. The electrolyte preferably is a redox electrolyte. Examples of a redox electrolyte include the $I^-/I_3^-$ system, the $Br^-/Br_3^-$ system and a quinone/hydroquinone system. Such a redox electrolyte can be obtained by commonly known methods. For instance, an electrolyte of the $I^-/I_3^-$ system can be obtained by mixing ammonium iodide and iodine. The electrolyte layer is constituted of a dispersion of such a redox electrolyte. Such an electrolyte dispersion which is in the form of a solution is called a liquid electrolyte, one in which an electrolyte is dispersed in a solid polymer at ordinary temperature is called a solid polymer electrolyte and one which is dispersed in a gelled material is called a gel electrolyte. In cases when a liquid electrolyte is used as an electrolyte layer, a solvent which is electrochemically inert is used, including, for example, acetonitrile, propylene carbonate and ethylene carbonate. As a solid electrolyte is cited, for example, an electrolyte described in JP-A No. 2001-160427 and as a gel electrolyte is cited, for example, an electrolyte described in "Hyomen Kagaku" (Surface Science) 21 [5] 288-293.

Opposed electrodes usable in the invention can employ any one that is electrically conductive. Any electrically conductive material is usable but one which has catalytic capability of allowing oxidation reaction of $I_3^-$ ions or reduction reaction of other redox ions to proceed at a sufficient rate is preferred. Examples of such a material include a platinum electrode, a platinum-plated or platinum-deposited conductive material, rhodium metal, ruthenium metal, ruthenium oxide and carbon.

The solar cell of the invention and its circuit are designed most suitably for solar light as one embodiment of the photoelectric conversion element of the invention, and having a structure which performs most suitable photoelectric conversion when using solar light as a light source, namely, a structure of exposing a dye-sensitized semiconductor to solar light. In one preferred embodiment of the solar light of the invention, the foregoing photoelectrode, electrolyte and opposed electrodes are housed in a case and sealed or the whole of them is sealed with a resin.

When the solar cell of the invention is exposed to a solar light or an electromagnetic wave equivalent to a solar light, a sensitizing dye born on a semiconductor absorbs the exposed light or electromagnetic wave and is excited. An electron generated upon excitation moves to the semiconductor and then moves to then opposed electrode through an electrically conductive support to reduce the redox electrolyte of the charge transfer layer. On the other hand, the sensitizing dye which has allowed the electron to move to the semiconductor becomes an oxidized product but is reduced via an electron being supplied from the opposed electrode through the redox electrolyte of a charge transfer layer, returning to the original state. Thus, electrons flow, which constitutes a solar cell using the photoelectric conversion element of the invention.

EXAMPLES

The invention will be further described with reference to examples.

Example 1

A commercially available titanium oxide paste (particle size: 18 nm) was coated on an electrically conductive, fluorine-doped tin oxide (FTO) glass substrate by a doctor blade method. After being dried with heating at 60° C. for 10 min, the past was burned at 300° C. for 30 min. Then, exemplified compound (1)–1 was dissolved in ethanol to prepare a solution of $3 \times 10^{-4}$ mol/L. The FTO glass having sintered titanium oxide was immersed into the foregoing solution at room temperature for 16 hrs. to perform dye adsorption onto the substrate, whereby a photoelectric conversion electrode was obtained. Thus, two photoelectric conversion electrodes were prepared and one of them was exposed to ozone in an atmosphere of ozone at 13 ppm for 20 min. A photoelectric conversion electrode was prepared using each of these exposed or unexposed electrodes.

There was prepared, as an electrolytic solution, a 3-methylpropionitrile solution containing 0.4 mol/L of lithium iodide, 0.05 mol/L of iodine and 0.5 mol/L of 4-t-butyl-pyridine. A platinum plate was used as an opposed electrode, and using the photoelectric conversion electrode before or after exposure to ozone, the electrolytic solution and a clamp cell, a photoelectric conversion cell (Example 1) was obtained.

Photoelectric conversion cells (Examples 2-7, Comparisons 1, 2) were prepared similarly to the foregoing cell (Example 1), except that exemplified compound (1)-1 was replaced by a dye compound shown in Table 1. Comparisons 1 and 2 used a Ru complex [which was dithiocyanato-bis(2,2'-bipyridyl-4,4'-dicarboxylato)ruthenium] and Dye A, respectively.

The thus obtained cells were each evaluated as below.

Using a solar simulator (produced by Wacom Denso, trade name: WXS-85-H type), each of the cells was exposed to the pseudo-solar light of a xenon lamp at 100 mW/cm² through an AM filter (AM-1.5). Using an I-V tester, the respective photoelectric conversion element was measured with respect to current-voltage characteristics to determine a short-circuit current ($I_{sc}$) and an open-circuit voltage ($V_{oc}$).

Evaluation results are shown in Table 1.

TABLE 1

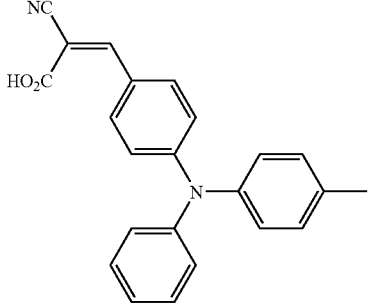

Dye A

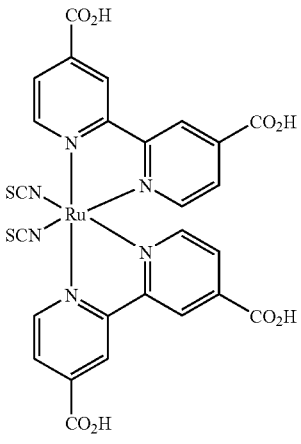

Ruthenium complex

| Example No. | Dye | Before Exposure to Ozone | | After Exposure to Ozone | |
|---|---|---|---|---|---|
| | | $I_{SC}$/mA | $V_{OC}$/V | $I_{SC}$/mA (%*1) | $V_{OC}$/V (%*2) |
| 1 | (1)-1 | 11.1 | 0.68 | 6.1 (55) | 0.66 (97) |
| 2 | (1)-4 | 12.5 | 0.71 | 5.9 (47) | 0.66 (93) |
| 3 | (2)-1 | 10.2 | 0.72 | 3.9 (38) | 0.65 (90) |
| 4 | (2)-4 | 11.8 | 0.71 | 7.6 (64) | 0.68 (96) |
| 5 | (2)-10 | 13.2 | 0.66 | 3.3 (25) | 0.63 (95) |
| 6 | (3)-3 | 9.4 | 0.63 | 2.6 (28) | 0.61 (97) |
| 7 | (3)-4 | 7.5 | 0.61 | 1.1 (13) | 0.55 (90) |
| Comp. 1 | Ru complex | 15.3 | 0.69 | 0.2 (1) | 0.22 (32) |
| Comp. 2 | Dye A | 8.1 | 0.67 | 0.5 (6) | 0.29 (43) |

*1 $I_{SC}$ ratio of after exposure to before exposure
*2 $V_{OC}$ ratio of after exposure to before exposure As apparent from Table 1, it was proved that dyes of examples 2-7 resulted in markedly reduced lowering of short-circuit current ($I_{sc}$) and open-circuit voltage ($V_{oc}$) between before and after exposure to ozone, compared to a Ru complex dye or dye A, indicating sensitizing dyes of enhanced durability, compared to conventional dyes.

On the electrically conductive FTO glass substrate used in Example 1 was coated an alkoxy-titanium solution (produced by Matsumoto Kosho, TA-25/IPA dilution) by a spin-coating method, allowed to stand at room temperature for 30 min. and then burned at 450° C. for 30 min. to form a short-circuited prevention layer. Subsequently, a commercially available titanium oxide paste (particle size: 18 nm) was coated on the substrate by a doctor blade method, heated at 60° C. for 10 min. and then burned at 500° C. for 30 min. to obtain a semiconductor electrode substrate having a 5 μm thick titanium oxide thin-layer.

The foregoing ruthenium complex was dissolved in ethanol to prepare a $3 \times 10^{-4}$ mol/L solution. The semiconductor electrode substrate was immersed in this solution for 16 hrs at room temperature to perform dye adsorption onto the substrate, then, washed in chloroform and dried under vacuum to obtain a photoelectric conversion electrode.

Subsequently, in a toluene solvent were dissolved 0.17 mol/L of a compound (spiro-MeO TAD) as a hole conveying agent, 0.33 mol/L of N(PhBr)₃SbCl₆ and 15 mmol/L of Li[(CF₃SO₂)₂N] and spin-coated onto the photoelectric conversion electrode obtained above, further, 30 nm thick gold was deposited through vacuum deposition to form an opposed electrode, whereby a photoelectric conversion element was obtained (Comparison 3).

Photoelectric conversion elements (Examples-8-10) were obtained similarly to the foregoing (Comparison (3)), except that the ruthenium complex was replaced by a compound shown in Table 2.

The thus obtained photoelectric conversion elements were evaluated similarly to Example 1. Results are shown in Table 2.

TABLE 2

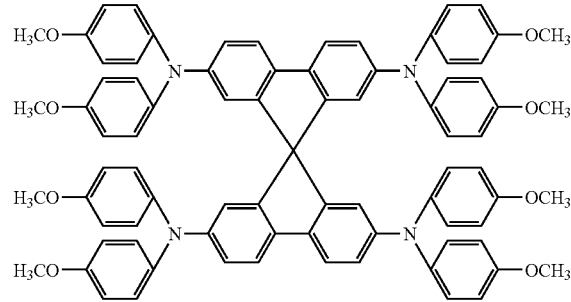

spiro-MeO TAD

| Example No. | Dye | Before Exposure to Ozone | | After Exposure to Ozone | |
|---|---|---|---|---|---|
| | | $I_{SC}$/mA | $V_{OC}$/V | $I_{SC}$/mA (%*1) | $V_{OC}$/V (%*2) |
| Comp. 3 | Ru complex | 3.3 | 0.64 | 0.1 (3) | 0.18 (28) |
| 8 | (1)-1 | 2.1 | 0.66 | 1.2 (57) | 0.61 (92) |
| 9 | (2)-1 | 1.8 | 0.67 | 0.8 (44) | 0.65 (97) |
| 10 | (3)-3 | 1.5 | 0.61 | 0.7 (46) | 0.58 (95) |

*1 $I_{SC}$ ratio of after exposure to before exposure
*2 $V_{OC}$ ratio of after exposure to before exposure As apparent from Table 2, it was proved that dyes of examples 8-10 resulted in markedly reduced lowering in short-circuit current ($I_{sc}$) and open-circuit voltage ($V_{oc}$) between before and after exposure to ozone, compared to a Ru complex dye, and indicating sensitizing dyes with enhanced durability, compared to conventional dyes.

What is claimed is:

1. A photoelectric conversion element comprising a semiconductor layer and an electrolyte layer provided between a pair of opposed electrodes, wherein the semiconductor layer is sensitized by a compound represented by formula (2) or (3)

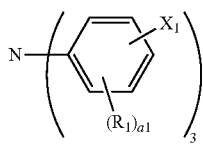

formula (2)

wherein $R_1$ is a halogen atom, a substituted or unsubstituted alkyl group, a substituted or unsubstituted alkoxy group, a substituted or unsubstituted aryl group, a substituted or unsubstituted alkenyl group, a substituted or unsubstituted amino group or a substituted or unsubstituted heterocyclic group; $X_1$ is an organic residue having an acidic group; and a1 is an integer of 0 to 4;

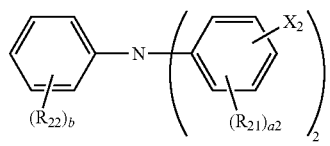

formula (3)

wherein $R_{21}$ and $R_{22}$ are each a halogen atom, a substituted or unsubstituted alkyl group, a substituted or unsubstituted alkoxy group, a substituted or unsubstituted aryl group, a substituted or unsubstituted alkenyl group, a substituted or unsubstituted amino group or a substituted or unsubstituted heterocyclic group; $X_2$ is an organic residue having an acidic group; and a2 and b are each an integer of 0 to 4, and wherein the organic residue having an acidic group comprises one selected from the group consisting of

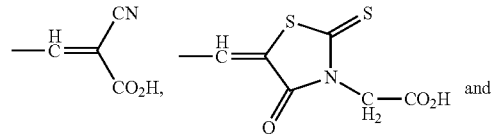

and

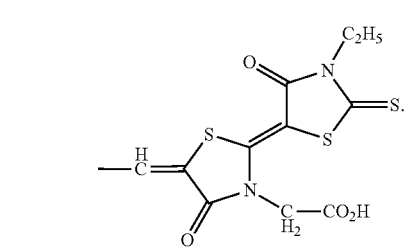

2. The photoelectric conversion element of claim 1, wherein the semiconductor layer is sensitized by a compound represented by the formula (2).

3. The photoelectric conversion element of claim 1, wherein the semiconductor layer is sensitized by a compound represented by the formula (3).

4. The photoelectric conversion element of claim 1, wherein the semiconductor layer comprises a semiconductor sensitized by the compound represented by the formula (2) or (3) and the semiconductor is at least one selected from the group consisting of $TiO_2$, $ZnO$, $SnO_2$, $Fe_2O_3$, $WO_3$, $Nb_2O_5$, $CdS$ and $PbS$.

5. The photoelectric conversion element of claim 1, wherein the semiconductor layer comprises a semiconductor sensitized by the compound represented by the formula (2) or (3) and the semiconductor is $TiO_2$.

6. The photoelectric conversion element of claim 1, wherein the compound represented by formula (2) or (3) is one selected from the group consisting of the following compounds (1)-1

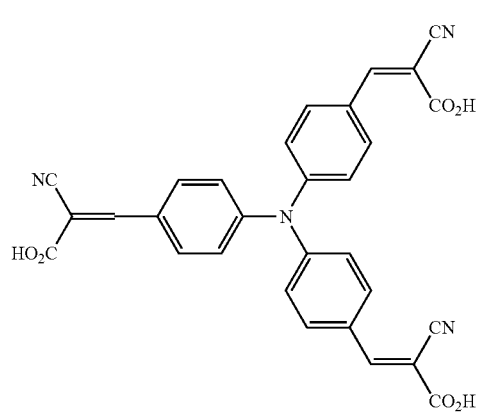

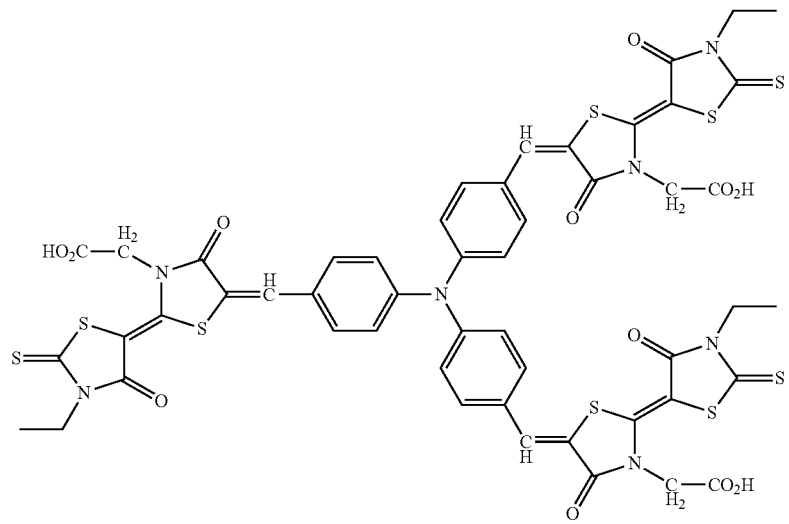
(1)-2
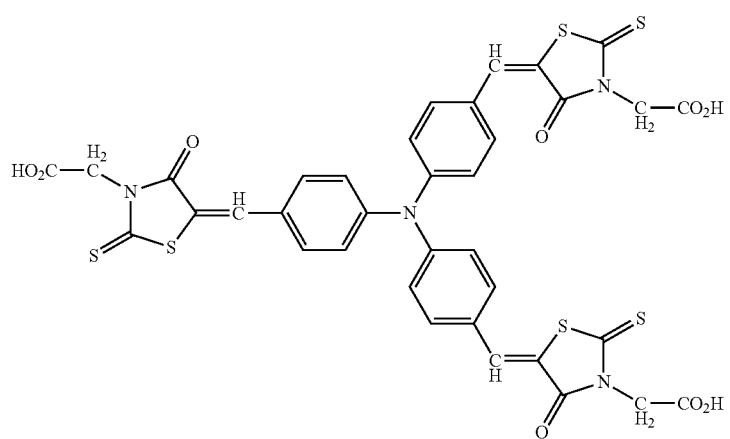
(1)-3
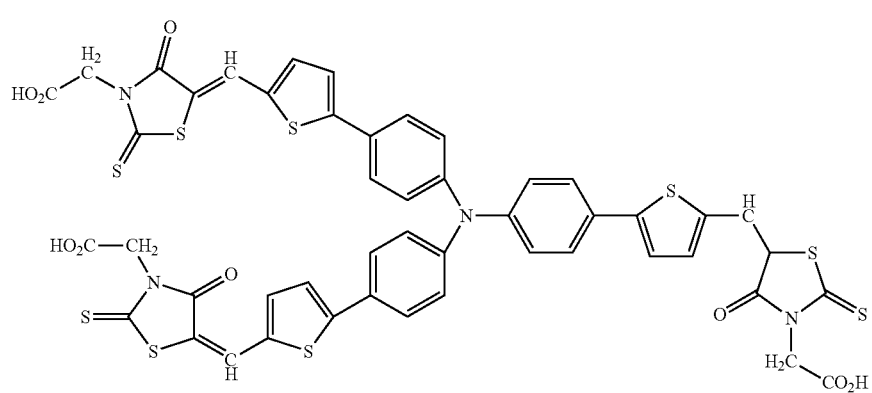
(1)-4

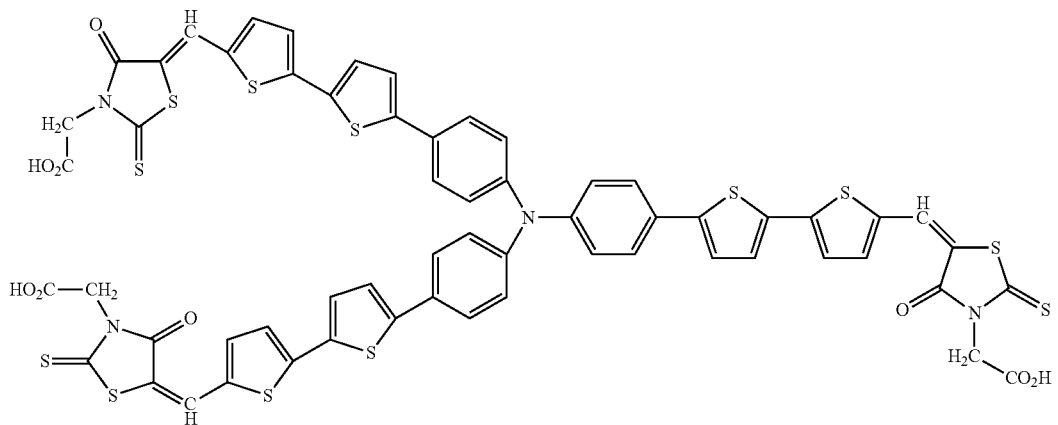
(1)-5
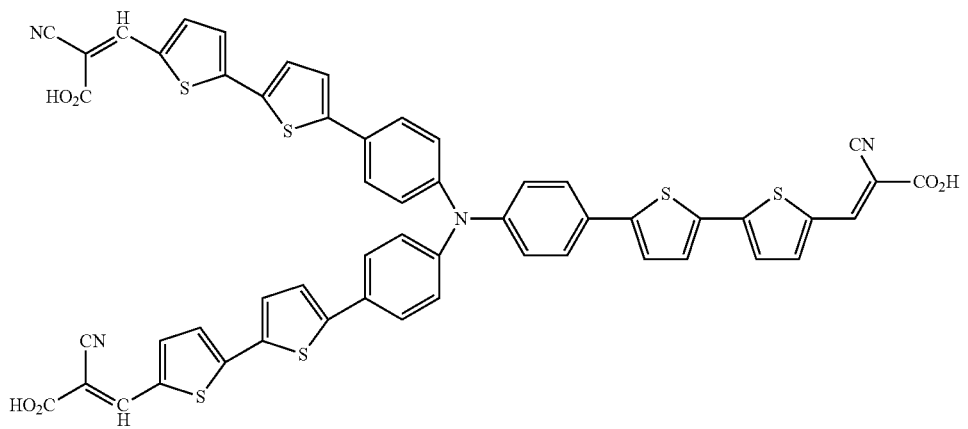
(1)-6
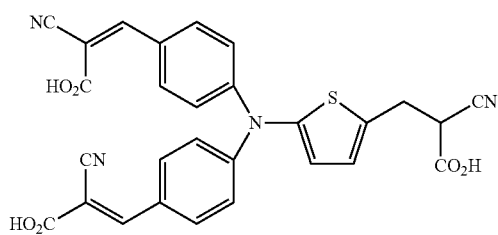
(1)-7
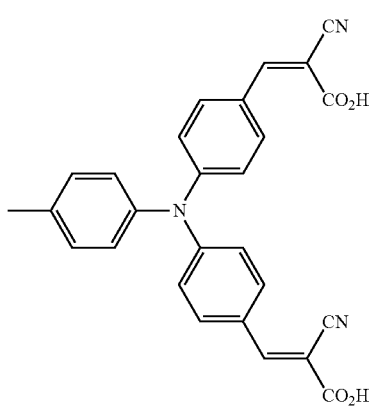
(2)-1

-continued
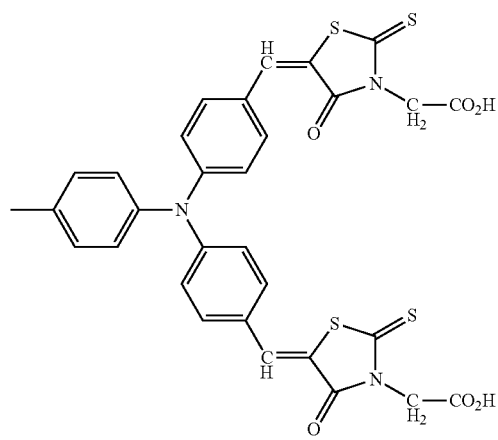
(2)-2
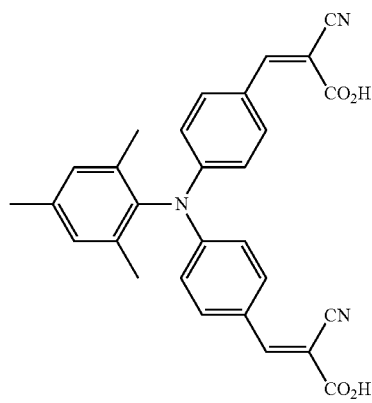
(2)-3
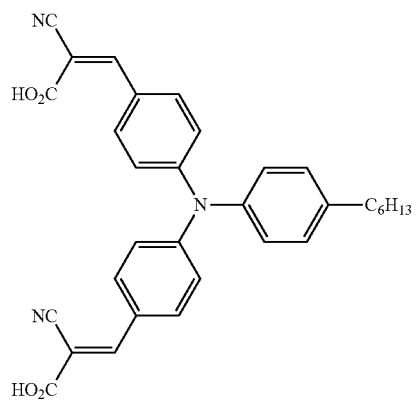
(2)-4
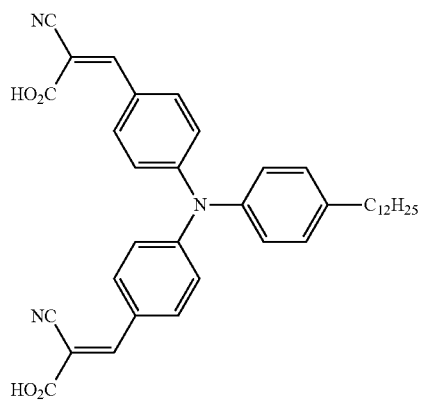
(2)-5
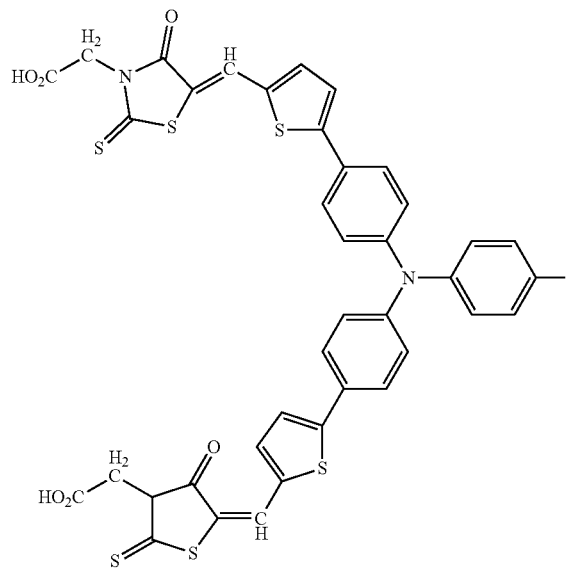
(2)-6
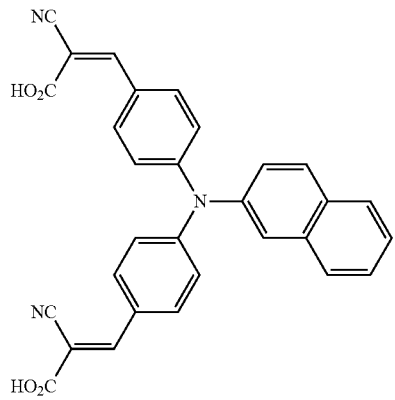
(2)-7

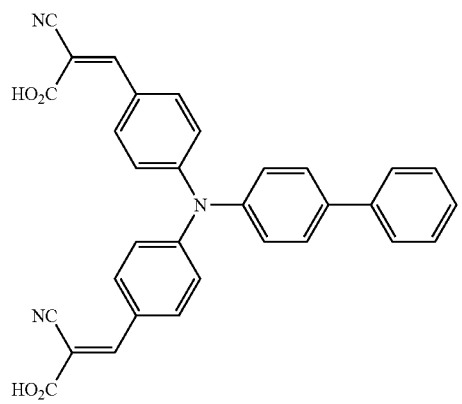
(2)-8
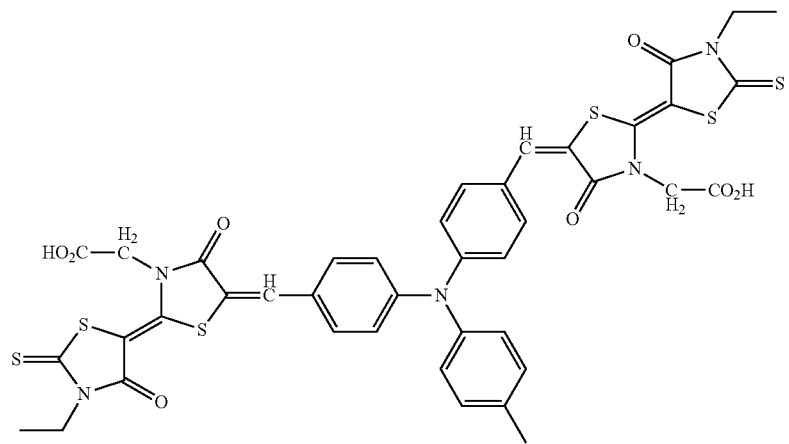
(2)-9
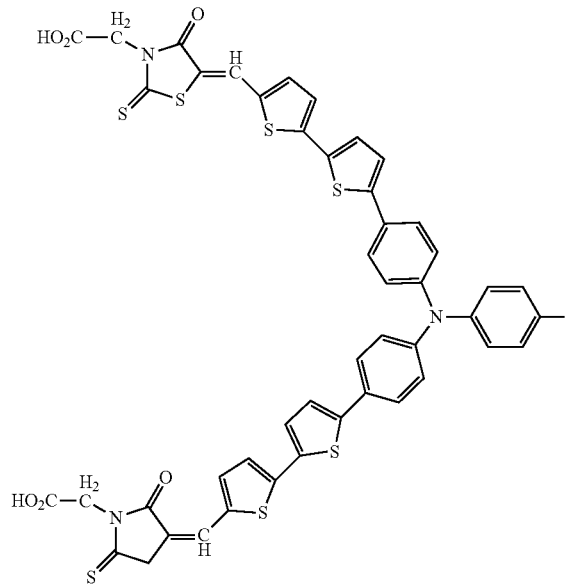
(2)-10

-continued
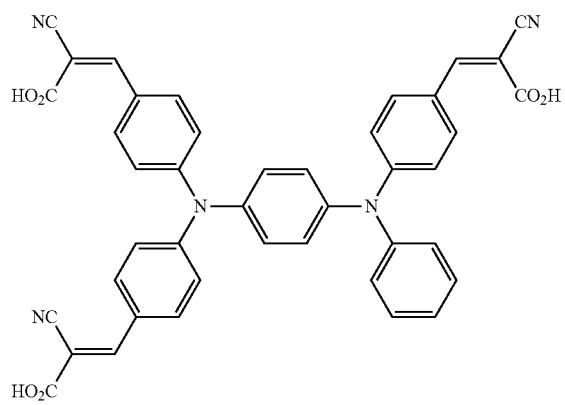
(3)-2
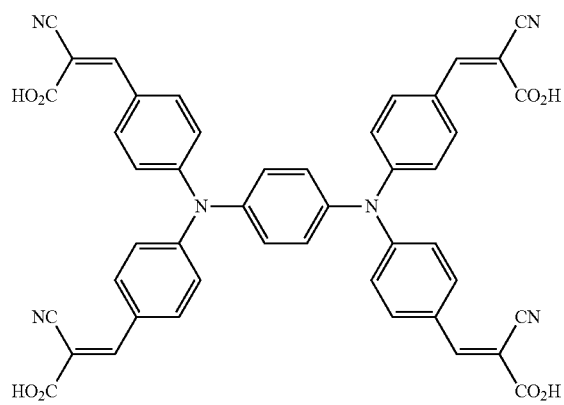
(3)-3
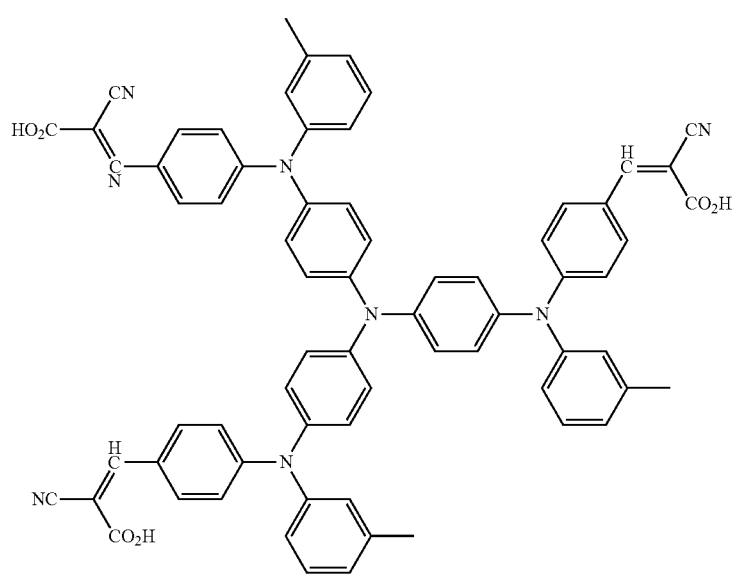
(3)-4
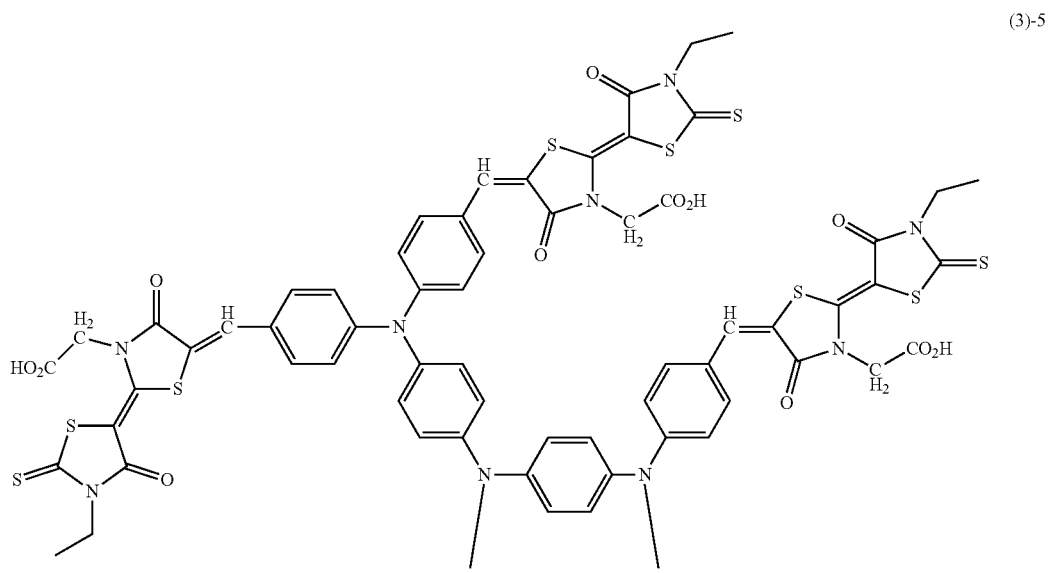
(3)-5

-continued
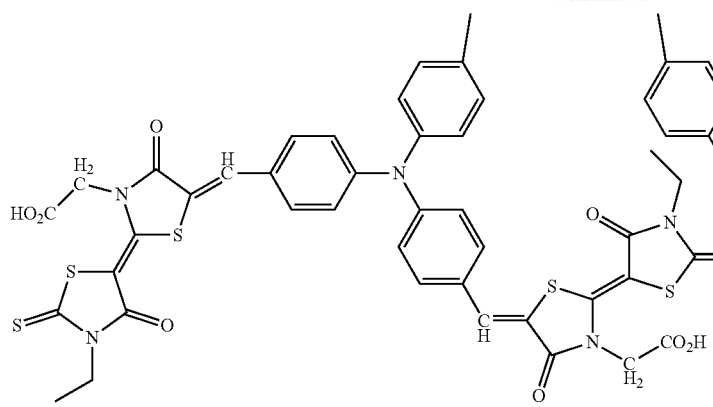
(3)-6
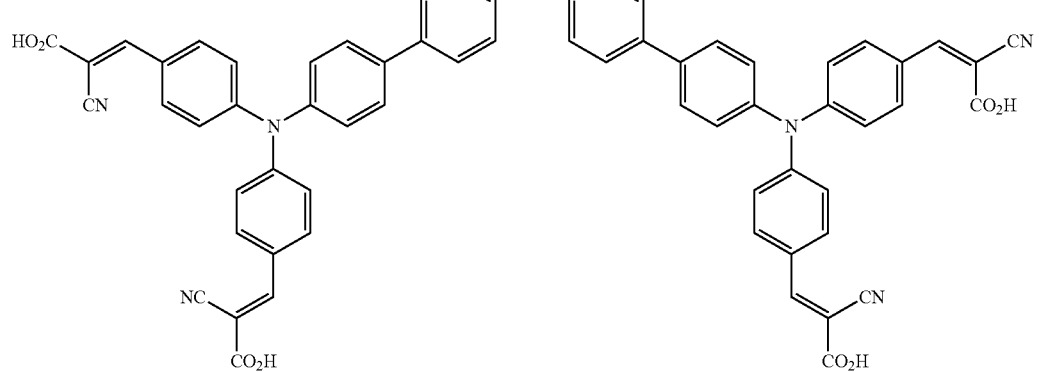
(3)-7
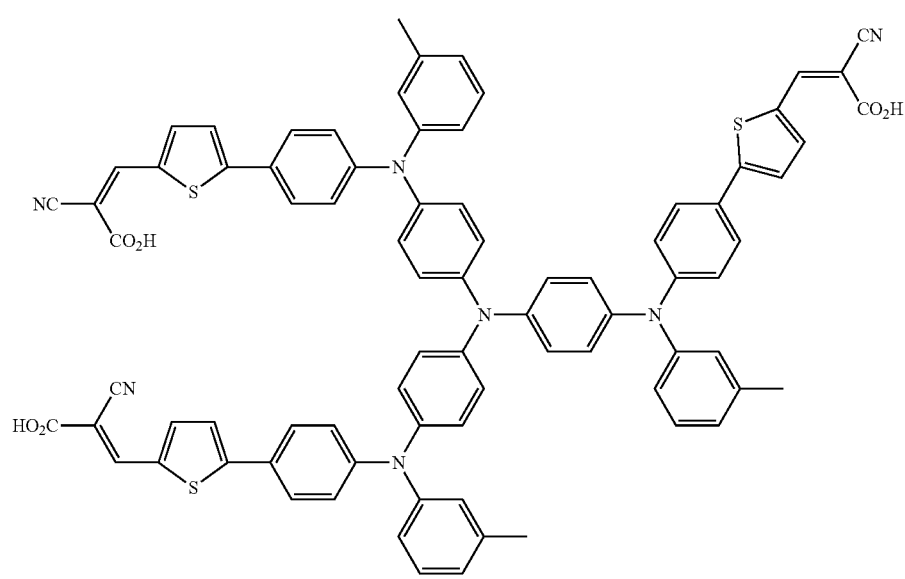

7. A solar cell comprising a photoelectric conversion element, wherein the photoelectric conversion element, wherein the photoelectric conversion element is a dye-sensitized photoelectric conversion element comprising a semiconductor layer and an electrolyte layer provided between a pair of opposed electrodes the semiconductor layer is sensitized by a compound represented by formula (2) or (3):

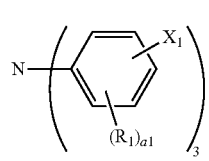

formula (2)

wherein $R_1$, is a halogen atom, a substituted or unsubstituted alkyl group, a substituted or unsubstituted alkoxy group, a substituted or unsubstituted aryl group, a substituted or unsubstituted alkenyl group, a substituted or unsubstituted amino group or a substituted or unsubstituted heterocyclic group; $X_1$ is an organic residue having an acidic group; and a1 is an integer of 0 to 4;

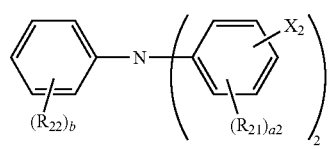

formula (3)

wherein $R_{21}$ and $R_{22}$ are each a halogen atom, a substituted or unsubstituted alkyl group, a substituted or unsubstituted alkoxy group, a substituted or unsubstituted aryl group, a substituted or unsubstituted alkenyl group, a substituted or unsubstituted amino group or a substituted or unsubstituted heterocyclic group; $X_2$ is an organic residue having an acidic group; and a2 and b are each an integer of 0 to 4, and wherein the organic residue having an acidic group comprises one selected from the group consisting of

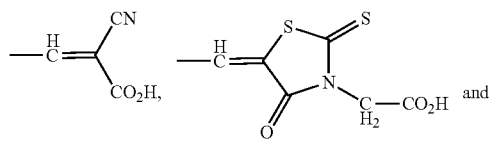

and

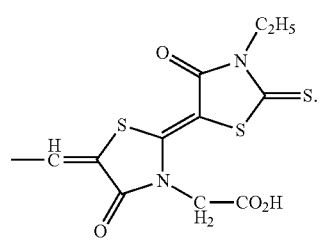

8. The solar cell of claim 7, wherein the semiconductor layer is sensitized by a compound represented by the formula (2).

9. The solar cell of claim 7, wherein the semiconductor layer is sensitized by a compound represented by the formula (3).

10. The solar cell of claim 7, wherein the semiconductor layer comprises a semiconductor sensitized by the compound represented by the formula (2) or (3) and the semiconductor is at least one selected from the group consisting of $TiO_2$, ZnO, $SnO_2$, $Fe_2O_3$, $WO_3$, $Nb_2O_5$, CdS and PbS.

11. The solar cell of claim 7, wherein the semiconductor layer comprises a semiconductor sensitized by the compound represented by the formula (2) or (3) and the semiconductor is $TiO_2$.

12. The solar cell of claim 7, wherein the compound represented by formula (2) or (3) is one selected from the group consisting of the following compounds:

(1)-1

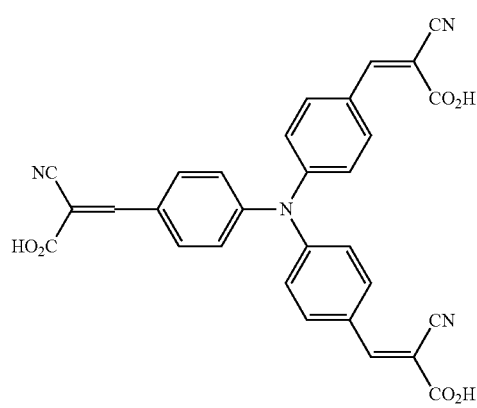

(1)-2
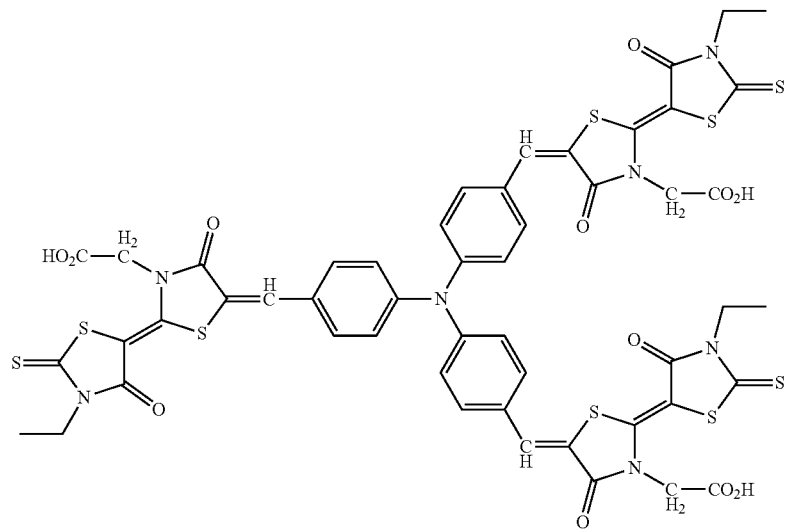
(1)-3
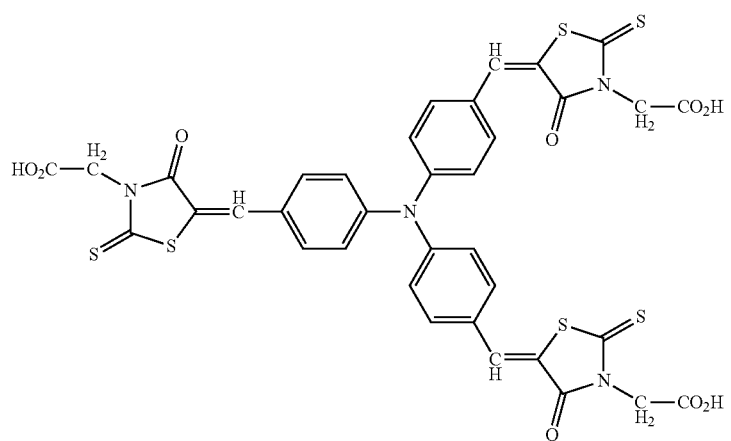
(1)-4
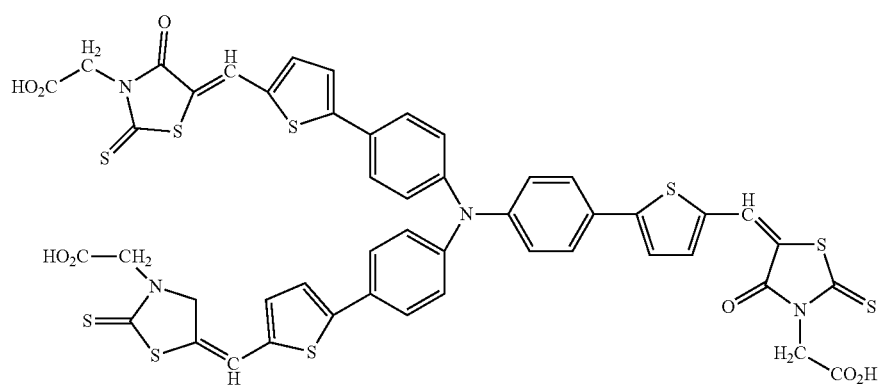

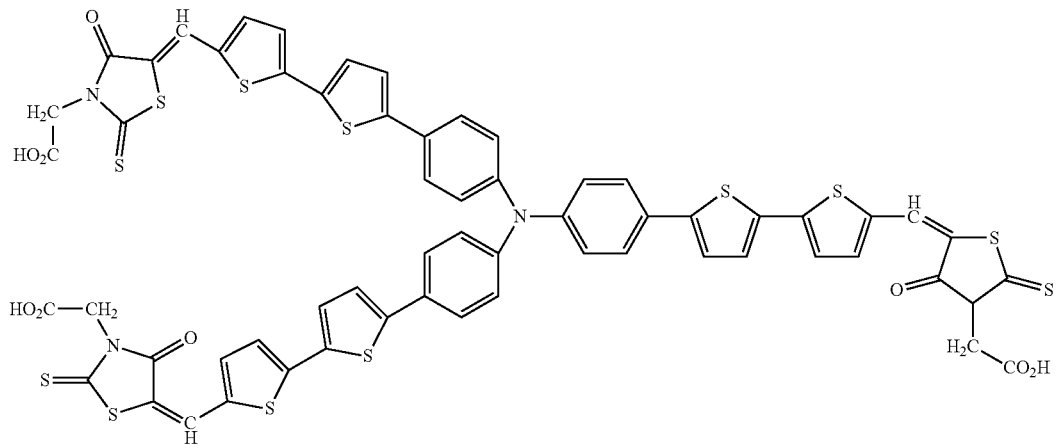
(1)-5
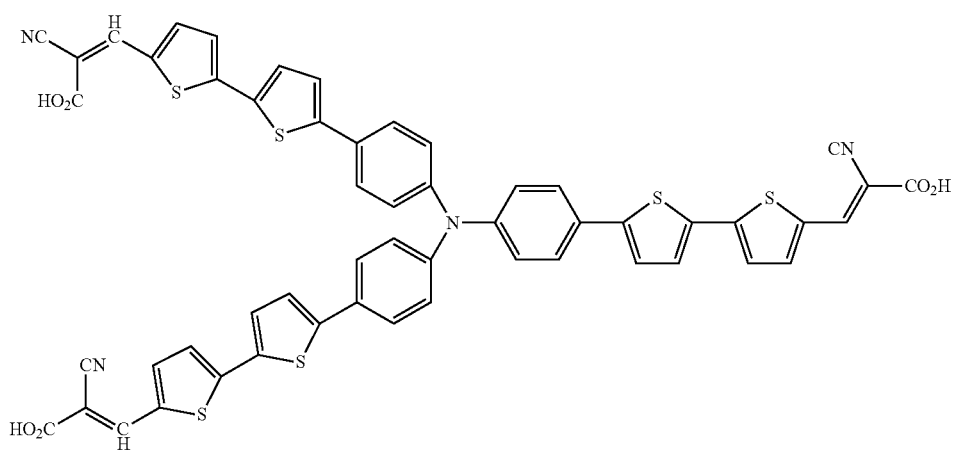
(1)-6
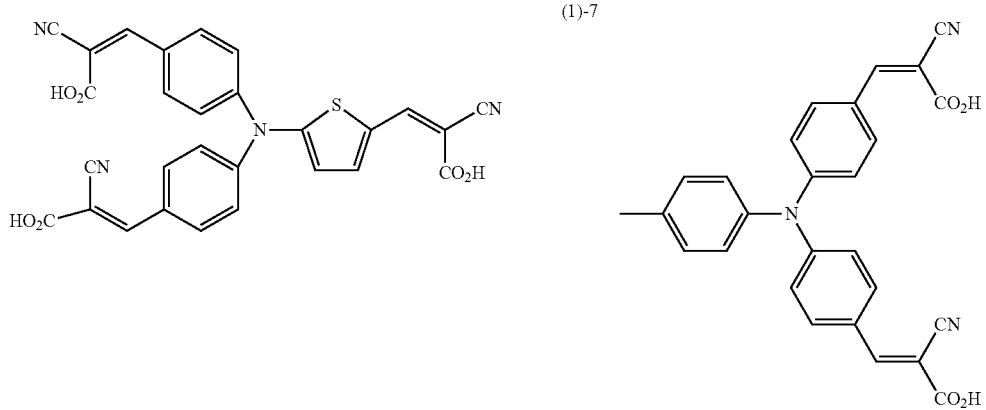
(1)-7
(2)-1

-continued
(2)-2
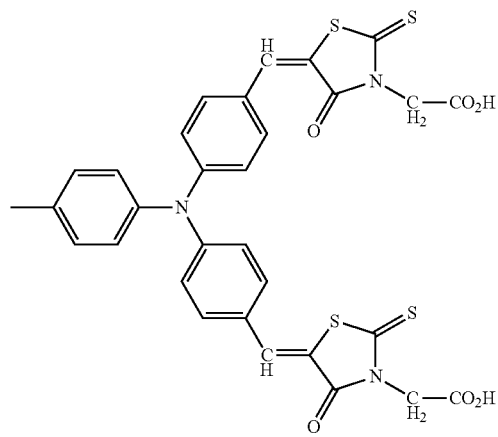
(2)-3
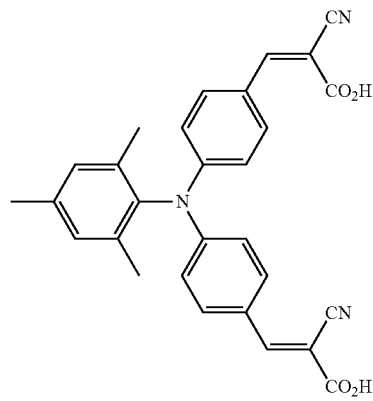
(2)-4
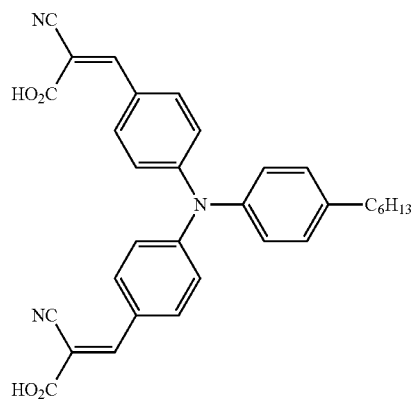
(2)-5
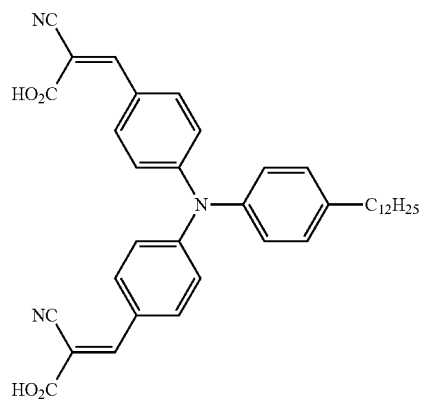
(2)-6
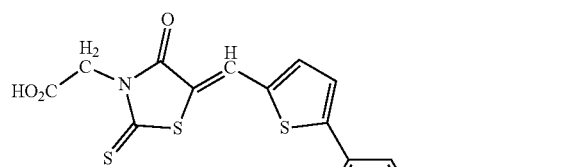
(2)-7
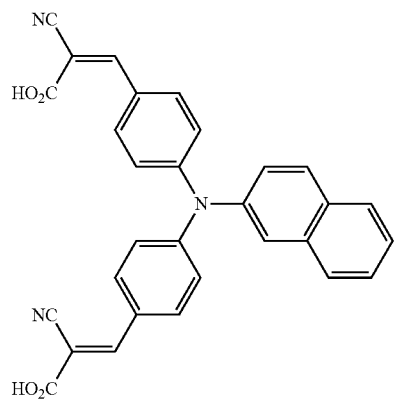
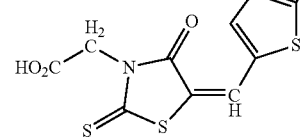

-continued
(2)-8
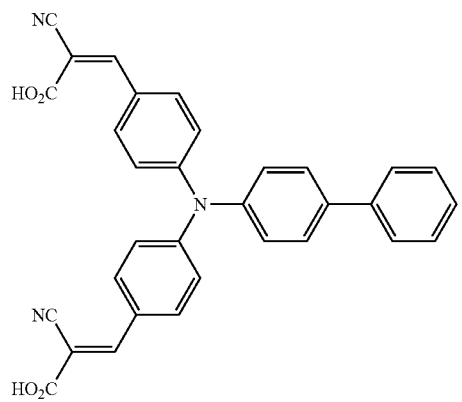
(2)-9
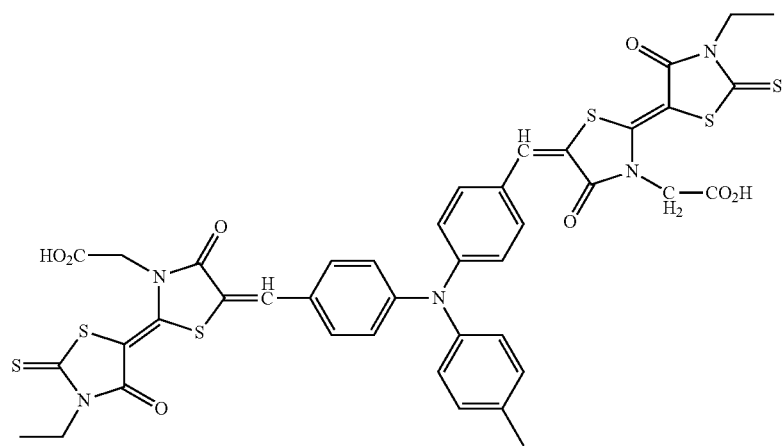
(2)-10
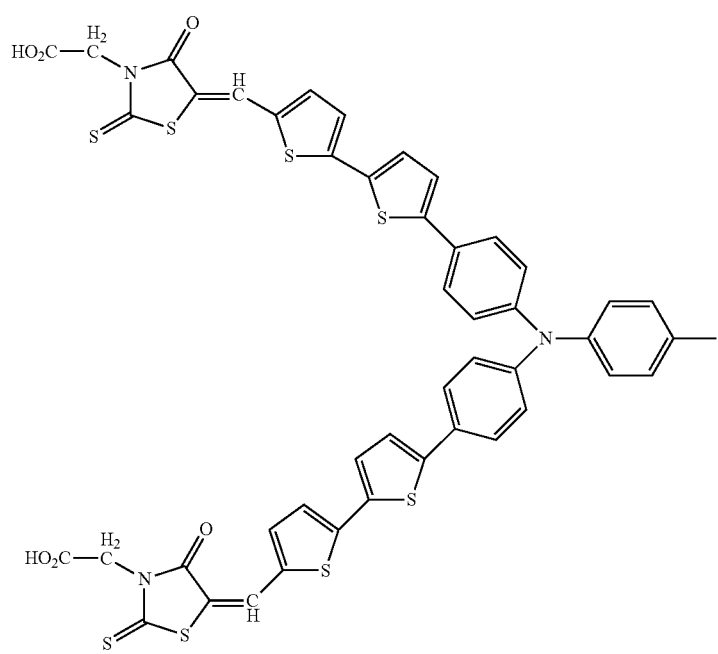

-continued
(3)-2
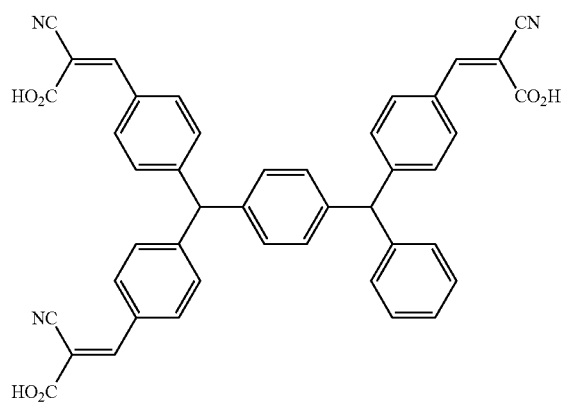
(3)-3
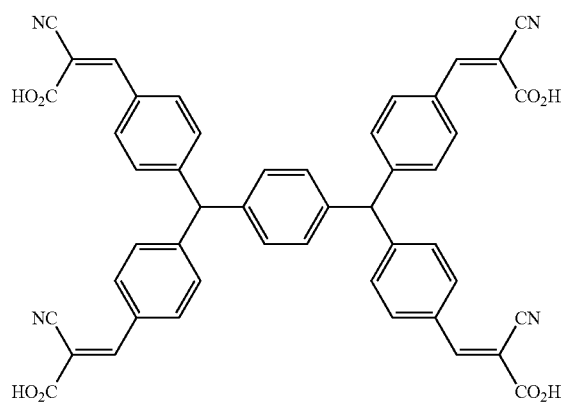
(3)-4
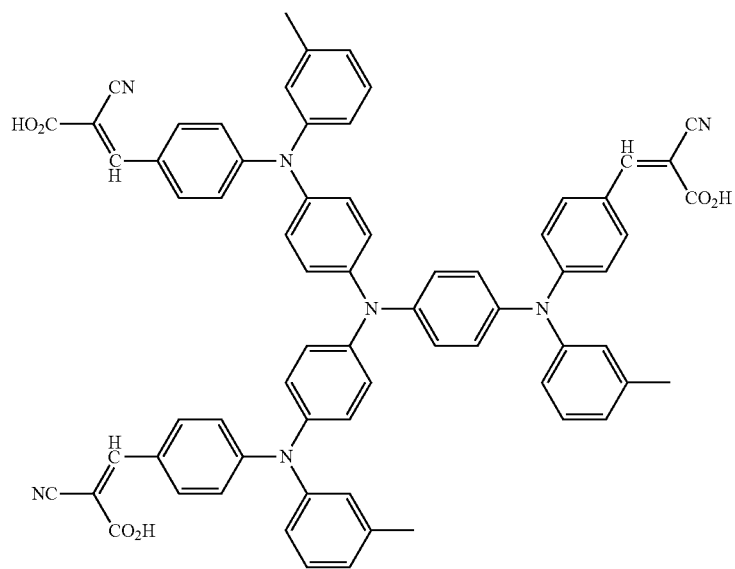
(3)-5
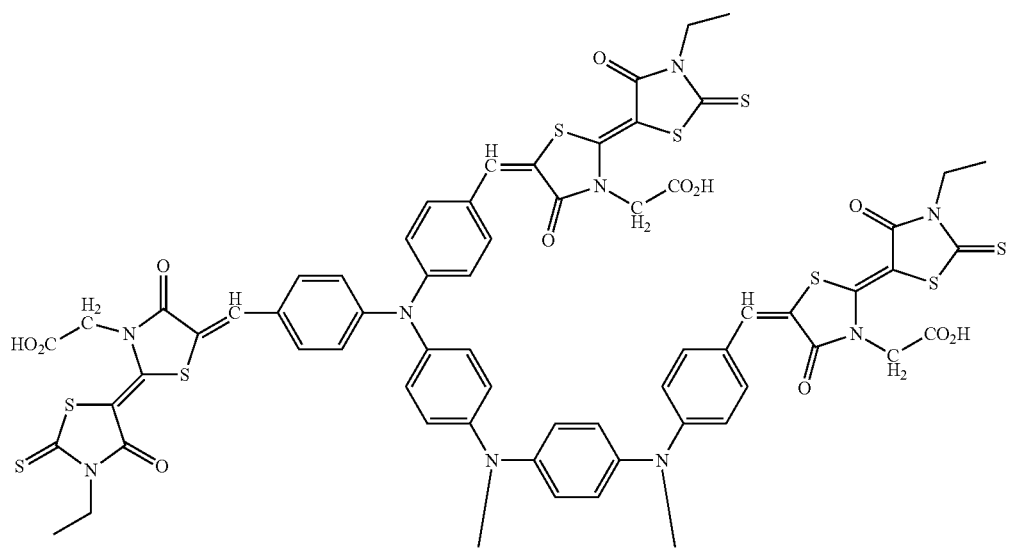

51    52
-continued
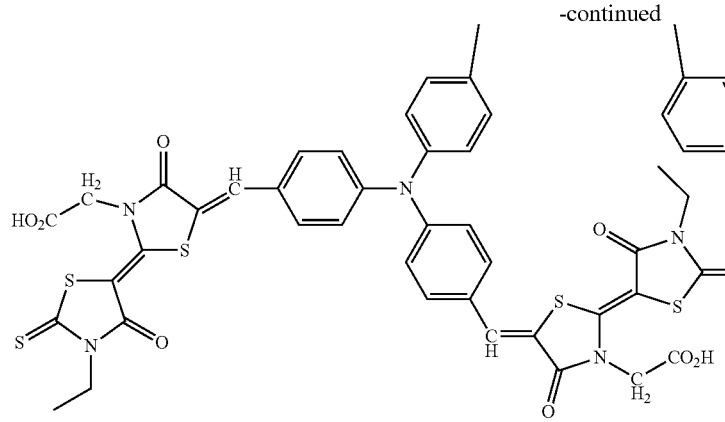
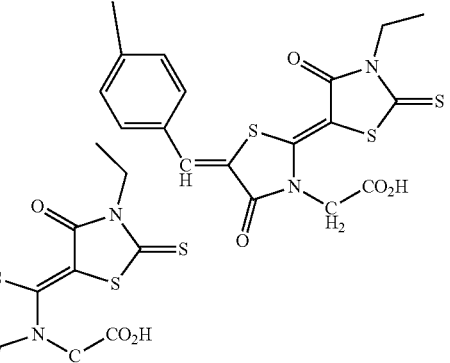
(3)-6
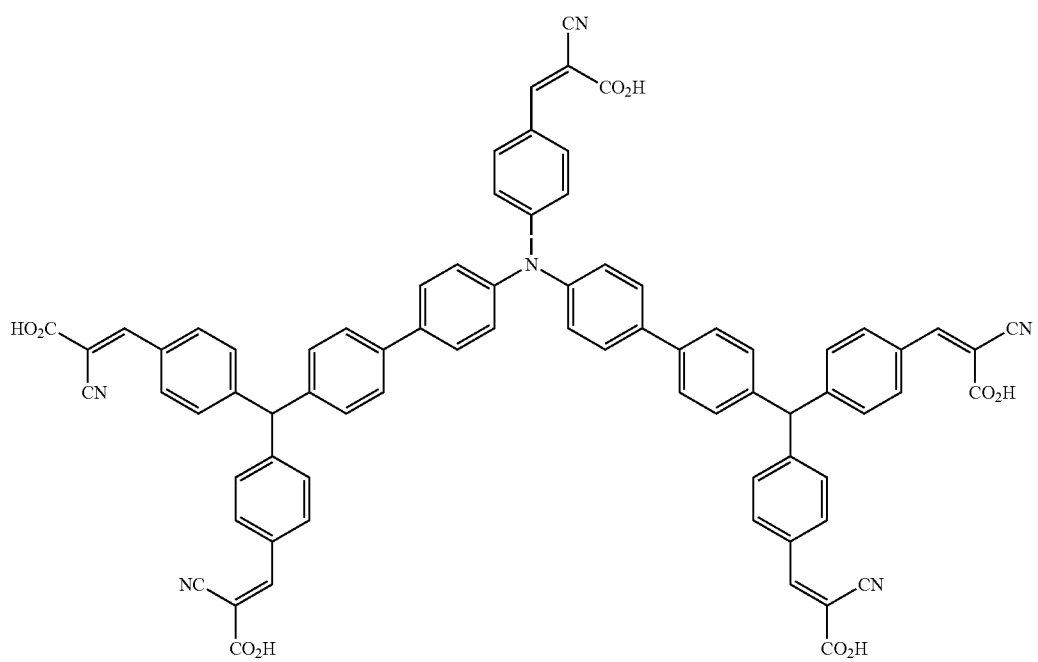
(3)-7
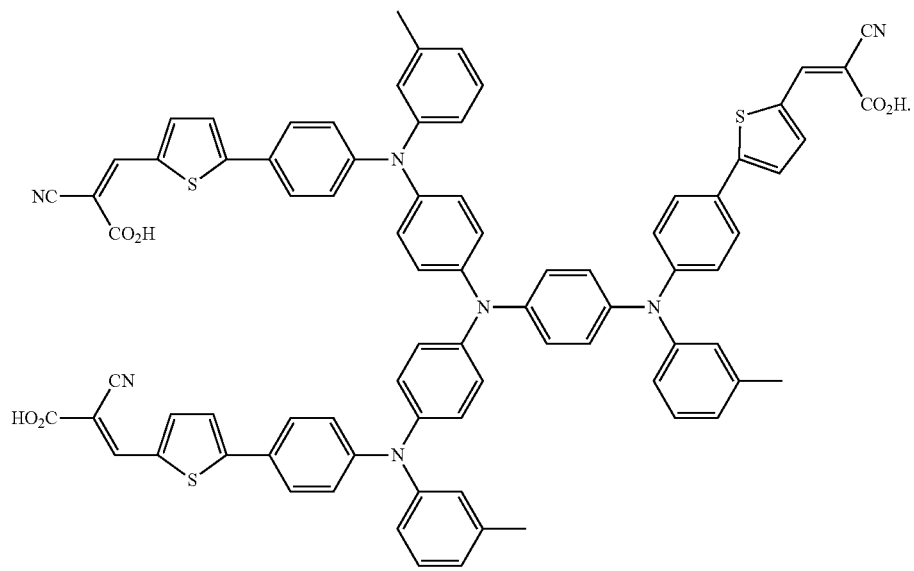
* * * * *